US011183655B2

(12) United States Patent
Saito et al.

(10) Patent No.: US 11,183,655 B2
(45) Date of Patent: Nov. 23, 2021

(54) PHOTOVOLTAIC DEVICE

(71) Applicant: Nissan Motor Co., Ltd., Yokohama (JP)

(72) Inventors: Yuji Saito, Kanagawa (JP); Tetsuya Hayashi, Kanagawa (JP); Shigeharu Yamagami, Kanagawa (JP); Yusuke Zushi, Kanagawa (JP); Yosuke Tomita, Kanagawa (JP); Keisuke Takemoto, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 540 days.

(21) Appl. No.: 16/325,041

(22) PCT Filed: Aug. 31, 2016

(86) PCT No.: PCT/JP2016/075579
§ 371 (c)(1),
(2) Date: Feb. 12, 2019

(87) PCT Pub. No.: WO2018/042579
PCT Pub. Date: Mar. 8, 2018

(65) Prior Publication Data
US 2021/0305524 A1    Sep. 30, 2021

(51) Int. Cl.
*H01L 51/44* (2006.01)
*H01L 51/42* (2006.01)
(Continued)

(52) U.S. Cl.
CPC .... *H01L 51/4266* (2013.01); *H01L 31/03048* (2013.01); *H01L 31/04* (2013.01)

(58) Field of Classification Search
CPC .............. H01L 51/4266; H01L 31/03048; H01L 31/04
See application file for complete search history.

(56) References Cited

U.S. PATENT DOCUMENTS

| 2004/0109666 | A1  | 6/2004  | Kim, II |
| 2011/0050042 | A1  | 3/2011  | Choi et al. |
| 2013/0255758 | A1* | 10/2013 | Rand ............... H01L 51/4253 136/255 |

FOREIGN PATENT DOCUMENTS

| JP | 2002-100793 A | 4/2002 |
| JP | 2004-152787 A | 5/2004 |

(Continued)

OTHER PUBLICATIONS

Liao et al., Three-color photodetector based on quantum dots and resonant-tunneling diodes coupled with conductive polymers, Solid-State Electronics Issue/vol. 54, pp. 1066-1070 (Year: 2010).*

(Continued)

*Primary Examiner* — Jayne L Mershon
(74) *Attorney, Agent, or Firm* — Global IP Counselors, LLP

(57) ABSTRACT

A photovoltaic device includes an organic semiconductor and an inorganic semiconductor. The organic semiconductor includes a photoactive region that generates excitons. The inorganic semiconductor has piezoelectricity and includes a dissociation region for dissociating carriers included in the excitons. A relationship of energy levels between the photoactive region and the dissociation region satisfies at least one equation $E_{LUMO} > E_C$ or equation $E_{HOMO} < E_V$.

20 Claims, 22 Drawing Sheets

(51) Int. Cl.
  *H01L 31/0304* (2006.01)
  *H01L 31/04* (2014.01)

(56) References Cited

FOREIGN PATENT DOCUMENTS

| | | |
|---|---|---|
| JP | 2004-532133 A | 10/2004 |
| JP | 2005-538573 A | 12/2005 |
| JP | 2010-56497 A | 3/2010 |
| JP | 2011-135058 A | 7/2011 |
| JP | 2014-179537 A | 9/2014 |

OTHER PUBLICATIONS

Lin et al., "Nanostructured metal oxide/conjugated polymer hybrid solar cells by low temperature solution processes," Journal of Materials Chemistry, Sep. 7, 2007, pp. 4571-4576, Issue 43, Royal Society of Chemistry, UK.

Liao et al., "Three-color photodetector based on quantum dots and resonant-tunneling diodes coupled with conductive polymers", Solid-State Electrics, Oct. 2010, pp. 1066-1070, vol. 54, Issue 10, Elsevier Science Publishers, UK.

Kim et al., "Nitride-organic semiconductor hybrid heterostructures for optoelectronic devices", Physica Status Solidi, May 31, 2007, pp. 2411-2414, vol. 4, Issue 7, Wiley-VCH, Germany.

* cited by examiner

PHOTOVOLTAIC DEVICE

CROSS-REFERENCE TO RELATED APPLICATIONS

This application is a U.S. national stage application of International Application No. PCT/JP2016/075579, filed on Aug. 31, 2016.

BACKGROUND

Technical Field

The present invention relates to a photovoltaic device.

Background Information

A photovoltaic device is known in which ZnO nanorods, which are inorganic semiconductors, are provided as columnar structures inside P3HT, which is an organic semiconductor. One example of such a photovoltaic device is disclosed in the Journal of Material Chemistry, "Nanostructured metal oxide/conjugated polymer hybrid solar cells by low temperature solution processes," 17, p. 4571 (2008) (Non-patent Document 1).

SUMMARY

However, in the conventional photovoltaic device described above, there is the problem of low conversion efficiency due to low exciton dissociation efficiency at the donor/acceptor interface.

The problem to be solved by the present invention is to provide a photovoltaic device with enhanced conversion efficiency.

The present invention solves the problem described above by means of a photovoltaic device, which comprises an organic semiconductor that includes a photoactive region that generates excitons and an inorganic semiconductor with piezoelectricity that includes an exciton dissociation region, wherein the relationship of energy levels between the photoactive region and the exciton dissociation region satisfies at least one of the following equations (1) or (2).

$$E_{LUMO} > E_C \quad (1)$$

$$E_{HOMO} < E_V \quad (2)$$

The present invention realizes the effect of providing a photovoltaic device with improved conversion efficiency.

DETAILED DESCRIPTION OF THE EMBODIMENTS

Figure 1:
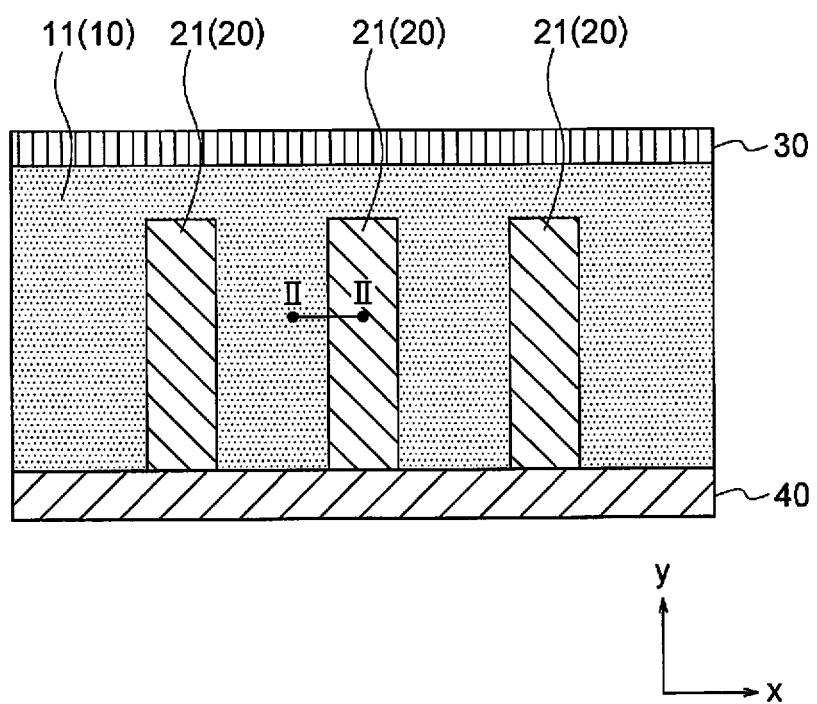
FIG. 1 is a cross-sectional view of a photovoltaic device according to this embodiment.

Embodiments of the present invention will be described below based on the drawings.

First Embodiment

The photovoltaic device according to this embodiment is a solar cell with a hybrid structure in which an organic semiconductor and an inorganic semiconductor are combined. The photovoltaic device according to this embodiment can find applications in which both high conversion efficiency and low cost are required, such as in automobiles. For example, when solar cells are used in an automobile, it is conceivable to install the solar cells in the body of the automobile. When solar cells are set in an ordinary passenger vehicle, the installable area for the solar cells is about 5 m². Thus, in order to use the electromotive force of the solar cells as a driving force for the vehicle, highly efficient solar cells are required.

Numerous solar cells have been developed heretofore, such as those listed below. For example, solar cells that are used in artificial satellites are tandem-type (multijunction-type) cells made of Group III-V monocrystalline semiconductors, such as GaAs. The energy conversion efficiency of these solar cells exceeds 30%, realizing high efficiency. However, there is the problem of extremely high cost. In addition, other examples of highly efficient solar cells, solar cells formed mainly from crystalline silicon (Si), CIS (Cu—In—Se: copper-iridium-selenium), or the like, are sold for domestic purposes. The conversion efficiency of these types of solar cells are at best about 20%. However, their cost is still high.

Examples of low-cost solar cells include amorphous silicon thin-film solar cells and organic thin-film solar cells. Amorphous silicon solar cells have higher photoabsorption coefficients compared to crystalline silicon. An amorphous silicon solar cell can be formed as a thin film with a thickness of about 100 nm on a non-crystalline substrate, such as a glass substrate. Since non-crystalline substrates are inexpensive, the overall cost of the solar cell can be suppressed. Organic thin-film solar cells can be produced at low cost since organic semiconductors, the material from which such cells are made, are inexpensive and can be prepared by means of a coating process, etc., without using high vacuum; however, with conversion efficiencies of about 10% in the research-and-development stage, which requires further improvement, there are many problems yet to be solved to achieve the generally accepted 7 ¥/kWh power generation cost target for solar cells.

Since solar cells do not discharge carbon dioxide during power generation and can be used as a means of generating power for distribution to electric power consumption sites, solar cells are applied to general households, buildings, artificial satellites, and various electrical products. Moreover, depending on the field of application, various solar cells are required to have different capabilities.

For example, in the case of artificial satellites, although extremely high conversion efficiencies are required, there is demand even at a relatively high cost; therefore, it is possible to use solar cells made from a Group III-V monocrystalline semiconductor, such as GaAs, as described above.

For example, since large installation areas of several tens of square meters can be realized and the electricity that is generated can be sold to electric power companies, solar cells of crystalline silicon, CIS, etc., for home-use, and organic thin-film solar cells that are expected to be installed in building windows, or the like are in demand, even at current prices and with conversion efficiencies of about 10-20%. And although the output of amorphous silicon thin-film solar cells is low, due to their low cost, such cells are in demand for electronic products that consume small amounts of power, such as calculators and wristwatches.

As described above, conventional solar cells, such as those described above, can find application as long as the requirements emphasize either conversion efficiency or cost. However, conventional solar cells do not satisfy demand to achieve both high conversion efficiency and low cost, such as in the automotive field. The photovoltaic device according to this embodiment is a solar cell that achieves both high conversion efficiency and low cost, and has the following configuration.

Figure 2:
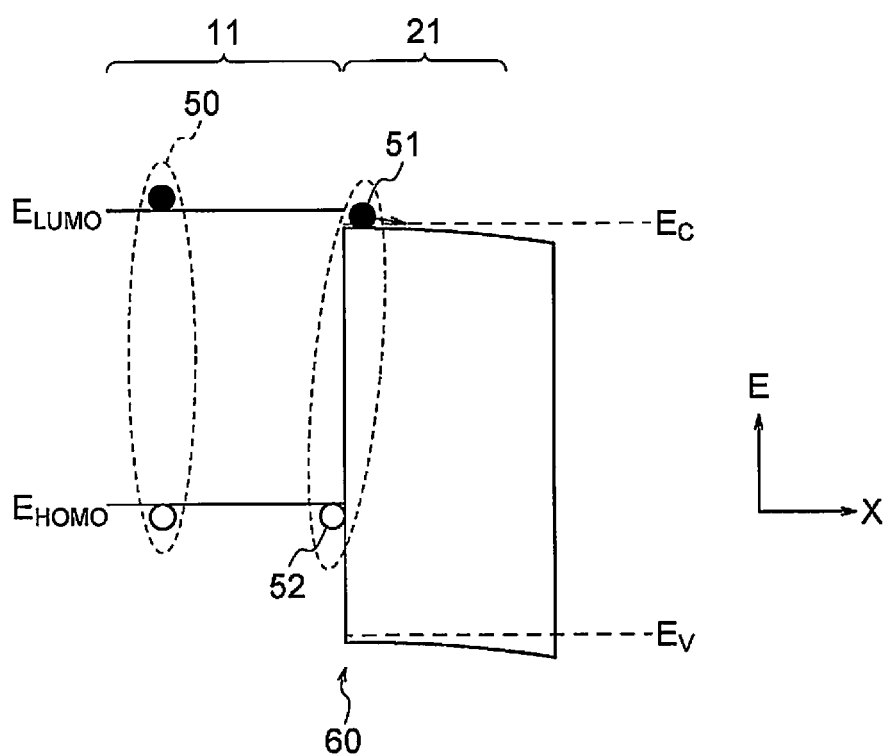
FIG. 2 is an energy diagram in cross section taken along line II-II of FIG. 1.

FIG. 1 is a cross-sectional view of a photovoltaic device according to this embodiment. FIG. 2 is an energy diagram in a cross section taken through line II-II of FIG. 1. The horizontal axis (X) in FIG. 2 indicates the same position as the x axis in FIG. 1, and the vertical axis (E) represents the energy magnitude.

The photovoltaic device comprises an organic semiconductor 10, an inorganic semiconductor 20, an anode electrode 30, and a cathode electrode 40. The organic semiconductor 10 is formed from an organic material and has a photoactive region 11. The organic semiconductor 10 is formed in a layer shape along the electrode surface of the anode electrode 30 and the electrode surface of the cathode electrode 40. The photoactive region 11 is a region that generates excitons by means of light from outside of the semiconductor element.

Examples of materials that form the photoactive region, that is, the organic materials included in the organic semiconductor include at least one selected from a group comprising P3HT, P3OT, P3DDT, PTAA, MEH-PPV, MDMO-PPV, F8BT, F8T2, POT-co-DOT, p-DTS (FBTTh 2) 2, DR3TSBDT, Pd (PPh)$_4$, benzoporphyrin, tetrabenzoporphyrin, phthalocyanine, tetracene, anthracene, triphenylene, pyrene, chrysene, tetraphen, perylene, coronene, hexabenzocoronene, PDI, PDITh, PC$_{60}$BM, PC$_{61}$BM, PC$_{70}$BM, PC$_{71}$BM, PC$_{84}$BM, bis PCS$_{60}$BM, PCBB, PCBO, PNTz4T, PNOz4T, ThC60BM, d5-PCBM, SIMEF, PEDOT:PSS, MADN, N719, N3, N907, YD2-o-C8, MK-1, MK-2, TA-St-CA, MR-1, MR-2, MR-3, and derivatives thereof. Derivatives include compounds derived from the molecular skeletons of the substances listed above.

The inorganic semiconductor 20 is formed from an inorganic material and has dissociation regions 21. In addition, the inorganic semiconductor 20 has piezoelectric properties. That is, the inorganic semiconductor 20 is an inorganic piezoelectric material. The inorganic semiconductor 20 is formed in a columnar shape in the organic semiconductor 10. The dissociation regions 21 included in the inorganic semiconductor 20 extend from the electrode surface of the cathode electrode 40 toward the anode electrode 30 and are formed in a columnar shape. The distal end portions of the dissociation regions 21 (the distal end portions positioned opposite to the cathode electrode when viewed in the direction of extension (y direction)) are not connected to the anode electrode 30 and are covered with an organic material. The end portions of the dissociation regions 21 positioned opposite to the distal end portions, on the other hand, are directly connected to the cathode electrode 40 and are also covered with the organic material. A plurality of the dissociation regions 21 are provided. The dissociation region 21 is a region in which the carriers contained in the excitons generated in the photoactive region are dissociated.

Examples of materials that form the dissociation region, that is, the inorganic materials included in the inorganic semiconductor 20 include at least one selected from a group comprising AlN, AlGaN, GaN, InGaN, InN, AlAs, AlGaAs, GaAs, InGaAs, InAs, AlP, AlGaP, GaP, GaAsP, GaAs, AlP, AlAsP, InAlAs, InAs, GaAsSb, GaSb, AlSb, AlGaSb, GaSb, AlSb, AlInSb, InSb, MgS, MgZnS, ZnS, MgS, MgSSe, MgSe, ZnS, ZnSSe, ZnSe, MgSe, MgZnSe, ZnSe, CuAlS$_2$, CuAlSSe, CuAlSe$_2$, CuAlS$_2$, CuGaAlS$_2$, CuGaS$_2$, CuGaSSe, CuGaSe$_2$, CuInGaS$_2$, CuInS$_2$, CuInSSe, CuInSe$_2$, CuGaSe$_2$, CuInGaSe$_2$, MgSe, MgZnSeTe, ZnTe, and derivatives thereof.

The anode electrode 30 is a positive electrode when the solar cell is viewed from the outside as a power source, and is formed on the front surface (upper surface) of the organic semiconductor 10. The cathode electrode 40 is a negative electrode and is formed on the rear surface (lower surface) of the organic semiconductor 10.

Next, the relationship between the energy levels at an interface 60 between the photoactive region 11 and the dissociation region 21 will be described with reference to FIG. 2. In the example shown in FIG. 2, the photoactive region 11 is a donor (p-type) and the dissociation region 21 is an acceptor (n-type). Excitons 50 are generated when the photoactive region 11 absorbs light, and some of the excitons 50 diffuse to the interface 60 between the photoactive region 11 and the dissociation region 21.

If the LUMO energy level of the photoactive region 11 is $E_{LUMO}$, the HOMO energy level of the photoactive region 11 is $E_{HOMO}$, the energy level at the lower end of the conduction band of the dissociation region 21 is $E_C$, and the energy level at the upper end of the valence band of the dissociation region 21 is $E_V$, the relationship between each of the energy levels can be represented by the following equations (1) and (2).

$$E_{LUMO} > E_C \tag{1}$$

$$E_{HOMO} >> E_V \tag{2}$$

The energy of the inorganic semiconductor can be generally explained by the band concept of solid-state physics, using the lower end of the conduction band (hereinafter referred to as "conduction band" or "$E_C$" (meaning E-Conduction Band)), the upper end of the valence band (hereinafter referred to as "valence band" or "$E_V$" (meaning E-Valence Band)), and the Fermi level ("$E_F$"). The energy of the organic semiconductor, on the other hand, can be generally explained by the frontier orbital theory, using LUMO (Lowest Unoccupied Molecular Orbital, hereinafter also referred to as $E_{LUMO}$); and HOMO (Highest Occupied Molecular Orbital, hereinafter referred to as $E_{HOMO}$), etc.

As indicated by equation (1) above, the LUMO energy level ($E_{LUMO}$) of the photoactive region 11 is higher than the energy level ($E_C$) of the lower end of the conduction band of the dissociation region 21. Thus, of the carriers contained in the excitons 50, only the electrons 51 move to the dissociation region 21. The HOMO energy level ($E_{HOMO}$) of the photoactive region 11 is higher than the energy level ($E_V$) of the upper end of the valence band of the dissociation region 21. Since an energy barrier is formed for the holes 52, the holes 52 do not move to the dissociation region 21. When the electrons 51 move to the dissociation region 21, the electrons 51 are in the same state as charge transfer complexes at the interface 60.

As described above, the dissociation region 21 is formed from an inorganic piezoelectric material. Thus, an electric field is generated in the dissociation region 21 due to the piezoelectric effect (piezo effect) of the crystals contained in the dissociation region 21. The electric field is generated due to stress-strain caused by the difference in thermal expansion, the difference in the lattice constants, etc., between the materials. Alternatively, the electric field is generated due to stress based on thermal energy of the semiconductor that is heated by receiving light.

The electrons 51 receive a force in a direction away from the interface 60. As shown in FIG. 2, the energy level at the lower end of the conduction band of the dissociation region 21 falls smoothly toward the direction away from the interface 60. In other words, the energy level of the lower end of the conduction band of the dissociation region 21 decreases gradually, with the energy level ($E_C$) at the interface 60 as the maximum energy. In particular, since the inorganic piezoelectric material has a high dielectric constant, it is possible to reduce the binding force that acts on the space between the electron and the hole due to the electric field. Therefore, it is possible to efficiently dissociate the excitons.

That is, an electric field is applied between the organic semiconductor 10, which is a donor, and the inorganic semiconductor 20, which is an acceptor, to promote the dissociation of the excitons. Furthermore, the electrons are able to move to the inorganic semiconductor 20, and the energy level ($E_C$) of the lower end of the valence band is inclined at a prescribed inclination (the energy level ($E_C$) is not horizontal), due to the electric field. Thus, it is possible to increase the dissociation efficiency of the excitons.

The differences in the binding force due to the dielectric constant will be described while comparing the organic semiconductor and the inorganic semiconductor.

The relative dielectric constants of organic semiconductors are extremely low values, for example, 4.4 for P3HT and 3.9 for PCBM. The relative dielectric constants of inorganic semiconductors, on the other hand, are high, 11.8 for silicon and 12.8 for GaAs. Here, there is a force of attraction due to the Coulomb force between negatively charged electrons and positively charged holes. The Coulomb force is represented by the following equation (3):

$$F = \frac{1}{4\pi\varepsilon_r\varepsilon_0} \cdot \frac{q_1 q_2}{r^2} \tag{3}$$

where F represents the Coulomb force, $\varepsilon r$ represents the relative dielectric constant, $\varepsilon_0$ represents the dielectric constant of vacuum, $q_1$ represents the electric charge (for example, of an electron), $q_2$ represents the electric charge (for example, of a hole), and r represents the electron-hole distance.

According to equation 3 above, to increase the dissociation efficiency of excitons, it is better to use the inorganic semiconductor with higher dielectric constant than the organic semiconductor. Thus, in the photovoltaic device according to this embodiment, in order to further increase the dissociation efficiency while providing the dissociation region 21 in the inorganic semiconductor 20, the dissociation region 21 is devised so that an electric field is generated therein.

That is, the photovoltaic device according to this embodiment generates many excitations by providing the light diffusion region 11 in the organic semiconductor 10, which has a high photoabsorption coefficient. In addition, the carriers contained in the excitons move beyond the interface while the excitons generated in the photoactive region are diffused at the interface 60; therefore, it is configured such that a prescribed energy matching relationship exists between the organic semiconductor 10 and the inorganic semiconductor 20.

Here, the material characteristics of the organic semiconductor and the material characteristics of the inorganic semiconductor when used in a solar cell will be described in detail.

Figure 3A:
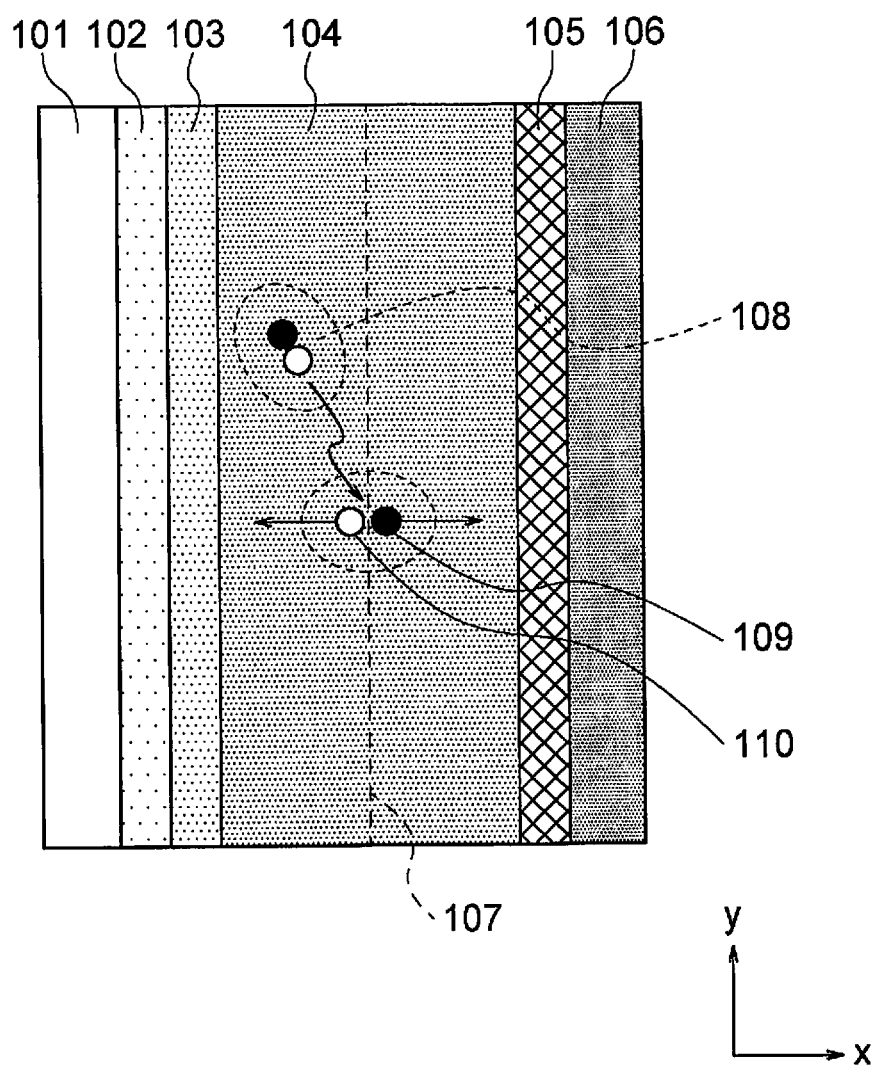
FIG. 3A is a cross-sectional view of an organic thin-film solar cell according to a first comparative example.

FIG. 3A shows a cross-sectional view of an organic thin-film solar cell according to a first comparative example. The organic thin-film solar cell according to the first comparative example comprises a transparent substrate 101, a transparent conductive film 102, a buffer layer 103, a photoactive region 104, a buffer layer 105, and a cathode electrode 106.

The transparent substrate 101 is a substrate of glass, etc. The transparent conductive film 102 is an anode electrode. The buffer layer 103 is a layer through which only holes can selectively pass. The photoactive region 104 is formed from an organic semiconductor. The buffer layer 105 is a layer through which only electrons can selectively pass. The transparent conductive film 102, the buffer layer 103, the photoactive region 104, the buffer layer 105, and the cathode electrode 106 are stacked on the transparent substrate 101 in that order. Light enters from the transparent substrate 101. Here, for the sake of simplicity, as an example, a donor-acceptor interface 107 (p-n interface) in the photoactive region is represented as a straight line for convenience as if it were a planar structure.

The incident light is absorbed by the photoactive region 104 and the excitation of electrons generates excitons 108. Some of the excitons 108 reach the donor-acceptor interface 107 due to diffusion and become charge transfer complexes. Thereafter, the excitons are dissociated into electrons 51 and holes 110, the electrons 51 reach the cathode electrode 106, and the holes 110 reach the transparent conductive film 102, which is the anode electrode, thereby being output to the outside as electric power.

Figure 3B:
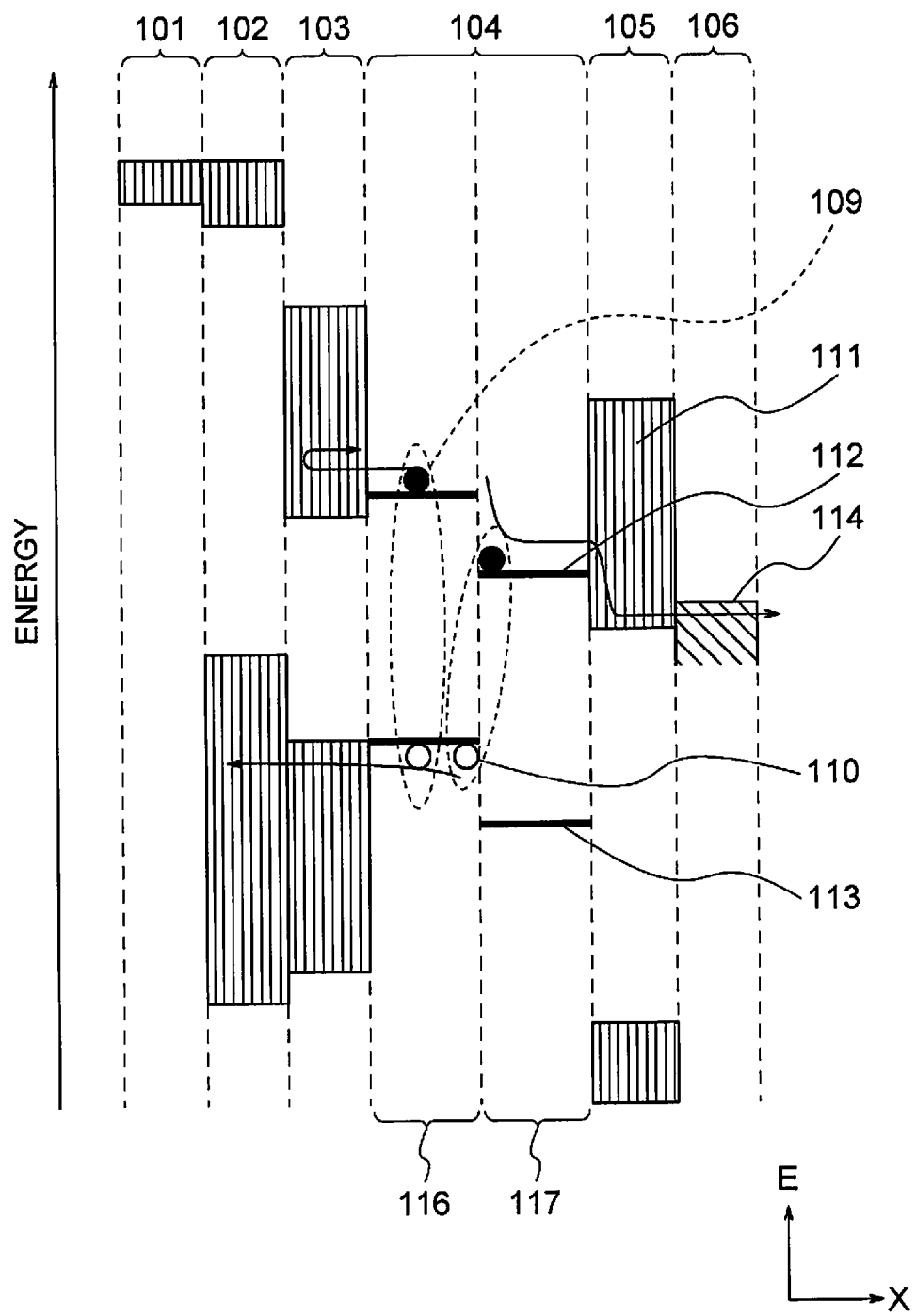
FIG. 3B is an energy diagram of the organic thin-film solar cell according to the first comparative example.

FIG. 3B is an energy diagram of the organic thin-film solar cell according to the first comparative example. The horizontal axis (X) in FIG. 3B indicates the depth-direction (x direction) position of the organic thin-film solar cell according to the first comparative example, and the vertical axis (Y) represents the electron energy magnitude. For holes, which are opposite in polarity to electrons, the negative direction of the vertical axis represents high energy.

Light enters the photoactive region 104 and the electrons at the donor HOMO energy level 113 are excited to the LUMO energy level 112, thereby forming holes 110 at the HOMO energy level 113 as missing electrons 51 and generating excitons 108, which are electron-hole pairs. When some of the excitons reach the p-n interface 107, due to the energy relationship between the HOMO energy level 113 and the LUMO energy level 112, only the electrons 51 can move from the donor 116 to the acceptor 117, whereas the holes 109 remain in the donor 116, thereby forming a charge transfer complex state. Here, due to the energy difference between the pn, the excitons 108 are dissociated into the electrons 51 and the holes 110 and move to the cathode electrode 106 and the transparent conductive film (anode electrode) 102 respectively.

Organic semiconductors are generally in the form of polymers (polymers) or monomers (monomers); while polymers are relatively large in size, in which electrons can move relatively easily, compared to inorganic semiconductors, polymers are small. In order for electrons to pass through the photoactive region of organic semiconductors, the electrons must move between the polymers by means of hopping conduction with the aid of thermal energy. Since the main component of carrier diffusion of organic semiconductors is hopping conduction, the diffusion length of the organic semiconductor is short. Thus, the carriers (electrons and holes), generated as a result of dissociation from the excitons 108, recombine before reaching the cathode electrode 106 and the transparent conductive film (anode electrode) 102, as is illustrated in FIG. 3B, and the excitons and the carriers generated by disassociation of excitons relax to their original energy levels before being taken out as electric power. Therefore, the conversion efficiency of the organic thin-film solar cell according to the first comparative example is reduced. In addition, since the diffusion length of the organic semiconductor is short and it is difficult to extract carriers, it is difficult to make the photoactive region of the organic semiconductor about 100 nm or more.

The solar cell disclosed in Non-patent Document 1 (hereinafter referred to as the semiconductor device according to a second comparative example) is known as a solar cell that remedies the characteristic short diffusion length of organic semiconductors. The solar cell according to the second comparative example is configured from a structure wherein an inorganic semiconductor with a columnar or dendrite-like structure penetrates an organic semiconductor.

In general, inorganic semiconductors are in a crystalline state or an amorphous state, but adjacent atoms are in a state of chemical bonding, such as covalent bonding, and electrons and holes can move between atoms relatively easily.

The carrier mobility is represented by the following equation (4):

$$L = \sqrt{D\tau} = \sqrt{\tau \frac{k_B T}{q} \mu} \tag{4}$$

Here, L represents diffusion length, D represents the diffusion coefficient, t represents carrier lifetime, kB represents Boltzmann's constant, T represents absolute temperature, q represents the electric charge element, and p represents mobility.

Thus, the carrier mobility is high, and, as shown by equation (4), inorganic semiconductors have the characteristic that the carrier diffusion length long. Inorganic semiconductors, on the other hand, have the problem that the photoabsorption coefficient (absorbance) is lower than that of organic semiconductors.

Figure 4:
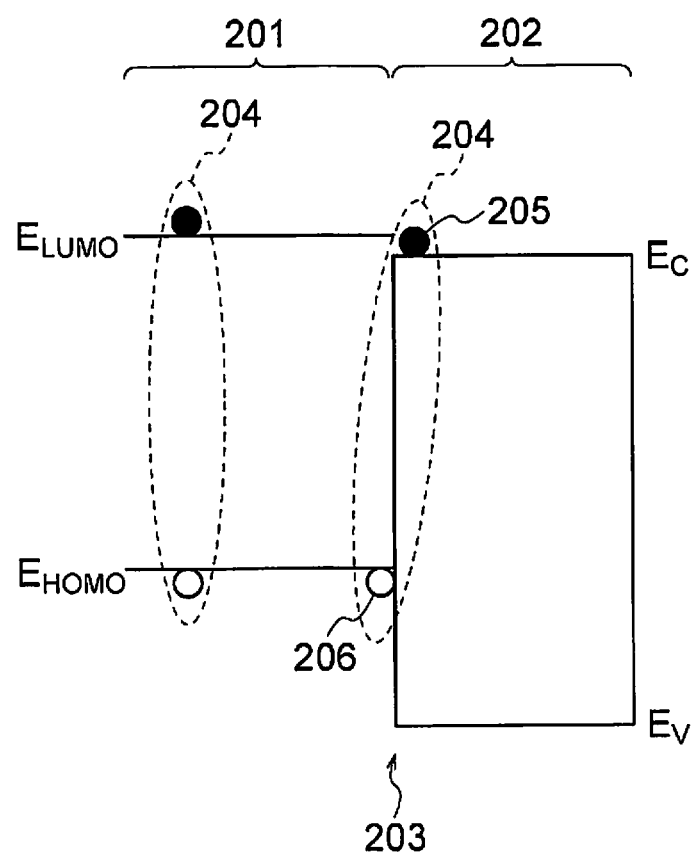
FIG. 4 is an energy diagram of a semiconductor device according to a second comparative example.

The semiconductor device according to the second comparative example has a structure that utilizes both the above-described characteristic of organic semiconductors and that of inorganic semiconductors. FIG. 4 is an energy diagram of the semiconductor device according to the second comparative example.

The semiconductor device according to the second comparative example has an interface 203 between the photoactive region 201 provided in the organic semiconductor and the dissociation region 202 provided in an inorganic semiconductor, as illustrated in FIG. 4. The LUMO energy level ($E_{LUMO}$) of the photoactive region 201 is higher than the energy level ($E_C$) at the lower end of the conduction band of the dissociation region 202.

Light enters the photoactive region 201 to generate excitons. When the excitons 204 reach the vicinity of the interface 203, the generated electrons 205 move from the donor to the acceptor, and the holes 206 remain in the donor. The excitons 204 thus dissociate in the vicinity of the interface.

Because the second comparative example is configured such that an electric field is applied to the dissociation region, as in the present invention, the energy level at the lower end of the conduction band of the dissociation region 202 is flat, as shown in FIG. 4. Thus, the dissociation efficiency is low. In addition, the electrons near the interface 60 cannot easily move to the electrode. That is, in the comparative example, there is no electric field to separate the electron-hole pairs. In addition, even if the excitons 204 are dissociated once due to the energy difference near the interface 203, the energy levels thereof do not further promote dissociation. As a result, the semiconductor device according to the second comparative example also has the problem of low conversion efficiency.

As described above, the photovoltaic device according to this embodiment comprises the organic semiconductor 10 that includes the photoactive region 11 and the inorganic semiconductor 20 with piezoelectricity that includes the dissociation region 21. The relationship of the energy levels between the photoactive region 11 and the dissociation region 21 satisfies equation (1) above. Thus, light absorption and the generation of excitons can be efficiently performed through the use of a high-absorption photoactive region. It is possible to realize a state in which the dielectric constant is high (the binding force between the electrons and the holes is weak) and the electrons contained in the excitons move to the dissociation region. In addition, the exciton dissociation efficiency can be increased by the electric field generated in the dissociation region 21. As a result, it is possible to increase the conversion efficiency.

In this embodiment, instead of making the LUMO energy level ($E_{LUMO}$) of the photoactive region 11 higher than the energy level ($E_C$) at the lower end of the conduction band of the dissociation region 21, the HOMO energy level ($E_{HOMO}$) of the photoactive region 11 may be made lower than the energy level ($E_V$) of the upper end of the valence band of the dissociation region 21. That is, the organic semiconductor 10 and the inorganic semiconductor 20 may be configured such that the energy relationships between the energy levels ($E_{LUMO}$, $E_{HOMO}$, $E_C$, $E_V$) satisfy the following equations (5) and (6):

$$E_{LUMO} << E_C \quad (5)$$

$$E_{HOMO} < E_V \quad (6)$$

As is indicated by the equation (6) above, the HOMO energy level ($E_{HOMO}$) of the photoactive region 11 is higher than the energy level ($E_V$) at the upper end of the valence band of the dissociation region 21. Thus, of the carriers contained in the excitons 50, only the holes 52 move to the dissociation region 21. The LUMO energy level ($E_{LUMO}$) of the photoactive region 11 is higher than the energy level ($E_C$) at the lower end of the conduction band of the dissociation region 21. Since an energy barrier is formed for the electrons 51, the electrons 51 do not move to the dissociation region 21. Then, due to the electric field that is generated in the dissociation region 21, the holes 52 receive a force in a direction away from the interface 60. It is thereby possible to increase the conversion efficiency while increasing the dissociation efficiency of the excitons.

In addition, in this embodiment, the dissociation region 21 is surrounded by the organic material that forms the organic semiconductor 10, and a part of the dissociation region 21 is directly connected to the cathode electrode 40. Thus, since the carriers are extracted from the inorganic semiconductor that has a long diffusion length, the carriers can be extracted efficiently. In addition, the film thickness of the photoactive region 11, which was restricted by the diffusion length, can be increased up to about the diffusion length of the dissociation region 21.

In this embodiment, the inorganic semiconductor 20 may include the photoactive region 11 in addition to the dissociation region 21. Of the light incident on the organic semiconductor 10, part of the light passes through the organic semiconductor 10. Since the inorganic semiconductor 20 has the function of the photoactive region 11, the light that passes through the organic semiconductor 10 can be used for power generation. Thus, the conversion efficiency can be improved.

In regard to the energy level conditions, the condition represented by equation (1) is a conditional equation for the behavior of the electrons. Equation (1) shows that the relationship of the energy level of the dissociation region 21 with respect to the photoactive region 11 is low in energy as seen from the energy level of electrons. In addition, the condition represented by equation (6) is a conditional equation for the behavior of the holes. Equation (6) shows that the relationship of the energy level of the dissociation region 21 with respect to the photoactive region 11 is low in energy as seen from the energy level of holes. That is, with respect to the ordinate of the graph shown in FIG. 2, the positive direction of the E axis represents the high energy side with respect to the energy with respect to electrons, and the negative direction of the E axis represents the high energy side with respect to the energy of the holes.

Second Embodiment

Figure 5:
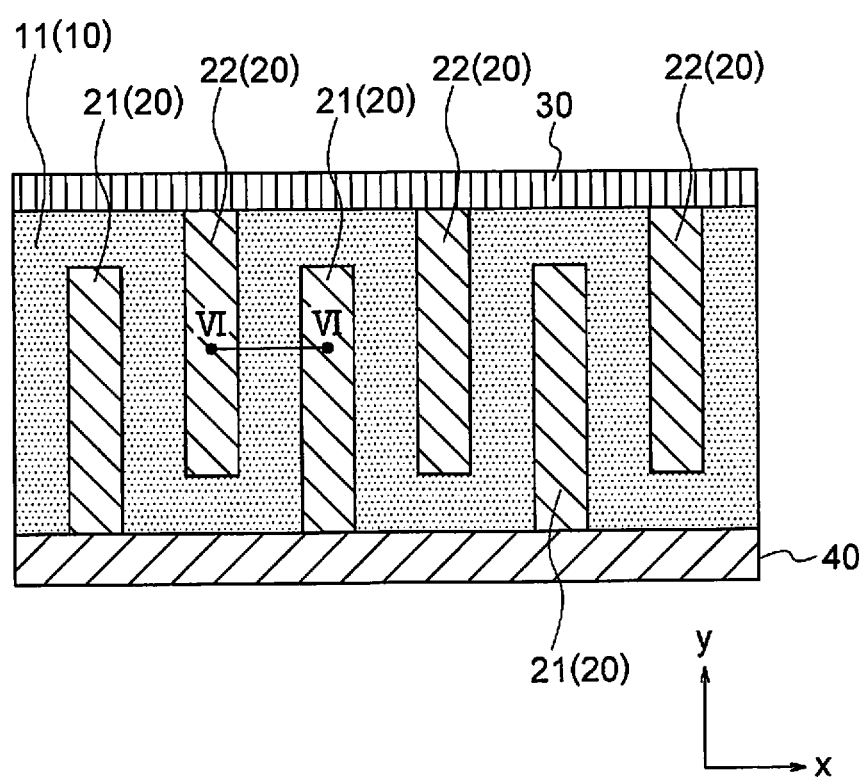
FIG. 5 is a cross-sectional view of the photovoltaic device according to another embodiment.

FIG. 5 is a cross-sectional view of the photovoltaic device according to another embodiment. In this embodiment, the configuration of the dissociation regions 21, 22 and the relationship of the energy levels are different from those of the first embodiment described. The other configurations are the same as those of the above-described first embodiment, and the descriptions thereof are incorporated by reference.

The photovoltaic device according to this embodiment comprises the organic semiconductor 10, the inorganic semiconductor 20, the anode electrode 30, and the cathode electrode 40.

The inorganic semiconductor 20 has a plurality of the dissociation regions 21 and of the dissociation regions 22. The dissociation regions 21, 22 are formed in a columnar shape in the organic semiconductor 10. The shape of the dissociation regions 21, 22 is needle-like (nanowire), columnar (nanorod), or circular (nanoparticle), etc.

The dissociation regions 21, columnar in form, extend from the electrode surface of the cathode electrode 40 toward the anode electrode 30. The distal end portions of the dissociation regions 21 (the distal end portions positioned opposite to the cathode electrode 40 when viewed in the direction of extension) are not connected to the anode electrode 30 and are covered with an organic material. The end portions of the dissociation regions 21 positioned opposite to the distal end portions, on the other hand, are directly connected to the cathode electrode 40 and are also covered with the organic material. The dissociation regions 21 are regions through which only electrons can pass.

The dissociation regions 22, columnar in form, extend from the electrode surface of the anode electrode 30 toward the cathode electrode 40. The distal end portions of the dissociation regions 22 (the distal end portions positioned opposite to the anode electrode 30 when viewed in the direction of extension (y direction)) are not connected to the cathode electrode 40 and are covered with an organic material. The end portions of the dissociation regions 22 positioned opposite to the distal end portions, on the other hand, are directly connected to the anode electrode 30 and are also covered with the organic material. The dissociation regions 22 are regions through which only holes can pass.

The dissociation regions 21, 22 are configured to have shapes that are continuous toward the respective electrodes. In addition, the dissociation regions 21, 22 are configured so that the angle between the direction of extension and the direction along the connection surface of each electrode is within 60°. If the inorganic material contained in the dissociation regions 21, 22 is discontinuous, the carriers must pass through the organic semiconductors by means of hopping conduction, so that the diffusion length becomes short. In this embodiment, since the dissociation regions 21, 22 have a continuous shape, it is possible to increase the diffusion length.

The plurality of the dissociation regions 21 and of the dissociation regions 22 are alternately arranged side by side in a direction orthogonal to the direction of extension of each region (direction along the electrode surfaces of the anode electrode 30 and the cathode electrode 40: x direction). It should be noted that the plurality of dissociation regions 21 and the plurality of the dissociation regions 22 need not be alternately arranged for each region. The order of arrangement of the dissociation regions may be such that, for example, three dissociation regions 22 are arranged between two dissociation regions 21. Additionally, the plurality of dissociation regions 21 and the plurality of the dissociation regions 22 need not be arranged in an aligned state.

The relationship between the energy levels at interfaces 61, 62 between the photoactive region 11 and the dissociation regions 21, 22 will be described with reference to FIG.

Figure 6:
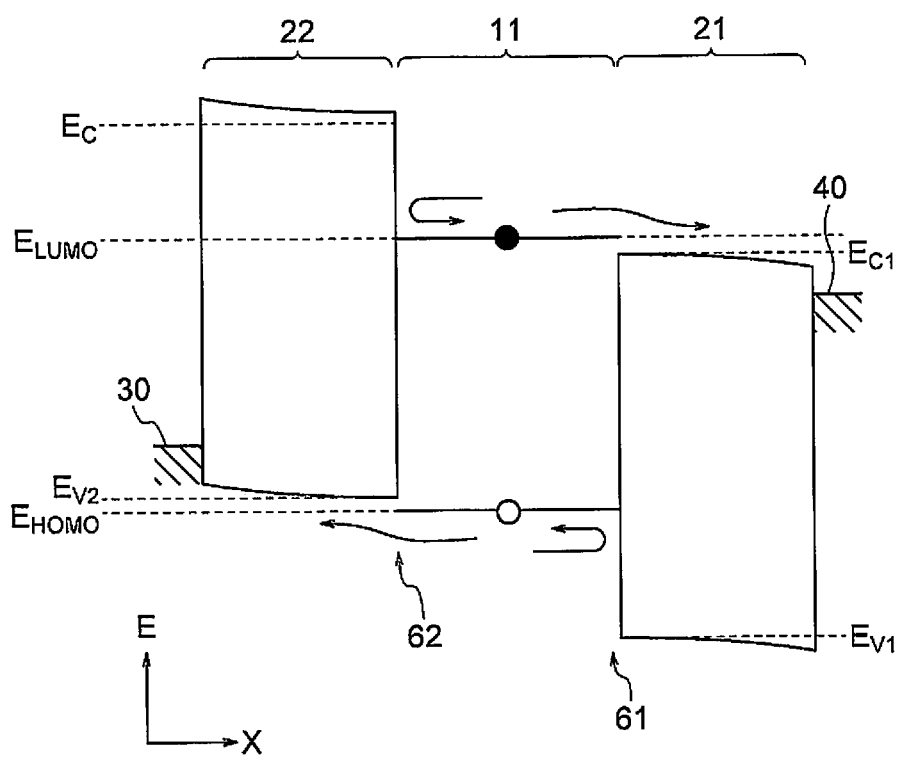
FIG. 6 is an energy diagram in a cross section taken through line VI-VI of FIG. 5.

6. FIG. 6 is an energy diagram in a cross section taken through line VI-VI of FIG. 5. The horizontal axis (X) in FIG. 6 indicates the same position as the x axis in FIG. 5, and the vertical axis (E) represents the energy magnitude.

The relationship of the energy levels at the interface 61 between the photoactive region 11 and the dissociation region 21 will now be described. If the LUMO energy level of the photoactive region 11 is $E_{LUMO}$, the HOMO energy level of the photoactive region 11 is $E_{HOMO}$, the energy level at the lower end of the conduction band of the dissociation region 21 is $E_{C1}$, and the energy level of the upper end of a valence band of the dissociation regions 21 is $E_{V1}$, the relationship between each of the energy levels can be represented by the following equations (7) and (8):

$$E_{LUMO} - E_{C1} \leq 0.3 \text{ [eV]} \tag{7}$$

$$E_{HOMO} - E_{V1} \geq 0.3 \text{ [eV]} \tag{8}$$

The relationship of the energy levels at the interface 61 between the photoactive region 11 and the dissociation regions 22 will now be described. If the energy level at the lower end of the conduction band of the dissociation regions 22 is $E_{C2}$ and the energy level at the upper end of the valence band of the dissociation regions 22 is $E_{V2}$, the relationship between each of the energy levels can be represented by the following equations (9) and (10):

$$E_{C2} - E_{LUMO} \geq 0.3 \text{ [eV]} \tag{9}$$

$$E_{V2} - E_{HOMO} \leq 0.3 \text{ [eV]} \tag{10}$$

Since the interface 61 and the interface 62 are heterojunction interfaces, which are junctions between dissimilar materials, an energy difference is generated between the LUMO and the conduction band or between the valence band and the HOMO. In the solar cell, since the energy difference at the interfaces 61, 62 causes a loss in voltage, the energy difference is made small. On the other hand, when the energy difference is small, some of the carriers may flow in the reverse, undesired direction, causing a reduction in the conversion efficiency. That is, in order to ensure a forward flow of carriers in the desired direction while preventing a reverse flow of carriers, it is preferable to set the energy difference to be within a prescribed range or up to a prescribed value.

Figure 7:
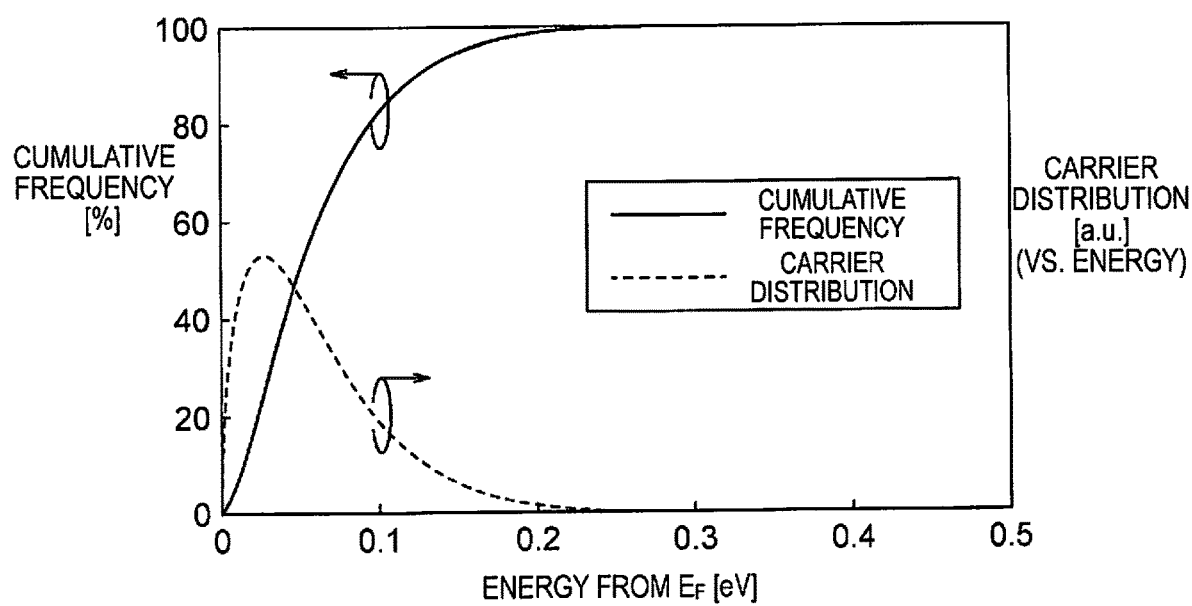
FIG. 7 is a graph illustrating the relationship between the energy dependence of carrier distribution and cumulative frequency of the same distribution after the Fermi level.

A preferred range for the energy difference will be described with reference to FIG. 7. FIG. 7 is a graph illustrating the relationship between the energy dependence of the carrier distribution and the cumulative frequency of the same distribution after the Fermi level. The energy dependence of the carrier distribution is calculated from the Fermi-Dirac distribution function and the state density under the condition of 150° C. (423.15 K) on the energy side above the Fermi level.

The frequency distribution of electrons with respect to energy in an object, independently of whether a material is organic or inorganic, follows the Fermi-Dirac distribution, except in those special cases when superconduction occurs. The cumulative frequency is 99.9% at 0.218 eV with respect to the Fermi level, which means that at least 99.9% of carriers are present within 0.218 eV from the Fermi level.

For example, the cumulative frequency is about 50% at 0.05 eV above the Fermi level. If the Fermi level of the dissociation region of the excitons is present in the vicinity of $E_C$ (assuming a position of virtually 0 eV below $E_C$) and the difference between the $E_{LUMO}$ of the photoactive region and $E_C$ of the dissociation region is $E_{LUMO} - E_C = 0.05$ eV, this indicates that half of the carriers can flow backwards. Even in p-type semiconductors, the Fermi level is present in a position of about 0.03 to 0.5 eV below $E_C$; therefore, the cumulative frequency is about 73% (value at $E_{LUMO} - E_C = 0.08$ eV in FIG. 7) or more even at $E_{LUMO} - E_C = 0.05$ eV, which is a practically applicable level.

That is, $E_{LUMO} - E_C$ is optimally 0.05 to 0.3 eV in order to sufficiently reduce the voltage loss that occurs due to the energy difference between $E_{LUMO}$ and $E_C$.

In solar cells, it is possible to take out the generated electrons and holes to the outside as electric power by taking the electrons and holes out from the different electrodes (anode and cathode), but the reverse carrier flow causes a reduction in the conversion efficiency of the solar cell. As described using the Fermi-Dirac distribution function illustrated in FIG. 7, about 99.9% or mom of the electrons and holes are distributed within 0.218 eV from the Fermi level even at 150° C. Thus, by forming a barrier of at least 0.2 eV, preferably at least 0.3 eV, between the photoactive region $E_{HOMO}$ and the valence band $E_{V1}$ of the dissociation regions 21 connected to the cathode electrode 40, the reverse flow of holes can be prevented. Similarly, for the electrons, by forming a barrier of at least 0.2 eV, preferably at least 0.3 eV, between the photoactive region $E_{LUMO}$ and the conduction band $E_{C1}$ of the dissociation regions 22 connected to the anode electrode 30, the reverse flow of electrons can be prevented.

As described above, in this embodiment, the relationships of the energy levels between the photoactive region 11 and the dissociation regions 21, 22 satisfy the following equations (11) and (12):

$$E_{LUMO} > E_{C1} \tag{11}$$

$$E_{HOMO} > E_{V1} \tag{12}$$

Thus, light absorption and the generation of excitons can be performed efficiently through the use of a high-absorption photoactive region. It is possible to realize a state in which the dielectric constant is high (the binding force between the electrons and the holes is weak) and the electrons contained in the excitons move to the dissociation regions 21 and the holes contained in the excitons move to the dissociation regions 22. In addition, the exciton dissociation efficiency can be increased due to the electric field generated in the dissociation regions 21, 22. As a result, it is possible to increase the conversion efficiency.

In addition, in this embodiment, the relationship of the energy levels at the interface 61 satisfies the equation (7) above. It is thereby possible to prevent the reverse flow of electrons and to reduce the voltage loss at the interface 61.

In addition, in this embodiment, the relationship of the energy levels at the interface 62 satisfies the equation (10) above. It is thereby possible to prevent the reverse flow of holes and to reduce the voltage loss at the interface 62.

In addition, in this embodiment, the relationship of the energy levels at the interface 61 satisfies the equation (8) above. It is thereby possible to prevent the reverse flow of holes and to reduce the voltage loss at the interface 61.

In addition, in this embodiment, the relationship of the energy levels at the interface 62 satisfies the equation (9) above. It is thereby possible to prevent the reverse flow of electrons and to reduce the voltage loss at the interface 62.

In addition, this embodiment includes the dissociation regions 21, through which, from among the carriers, electrons are allowed to pass through, and the dissociation regions 22, through which, from among the carriers, holes are allowed to pass through; and the dissociation regions 21, 22 are surrounded by the organic material that forms the organic semiconductor 10, parts of the dissociation regions 21 are directly connected to the electrode 40, and parts of the dissociation regions 22 are directly connected to the electrode 30. Efficient carrier extraction can be performed since the electrons and holes pass through regions with a long diffusion length.

Figure 8:
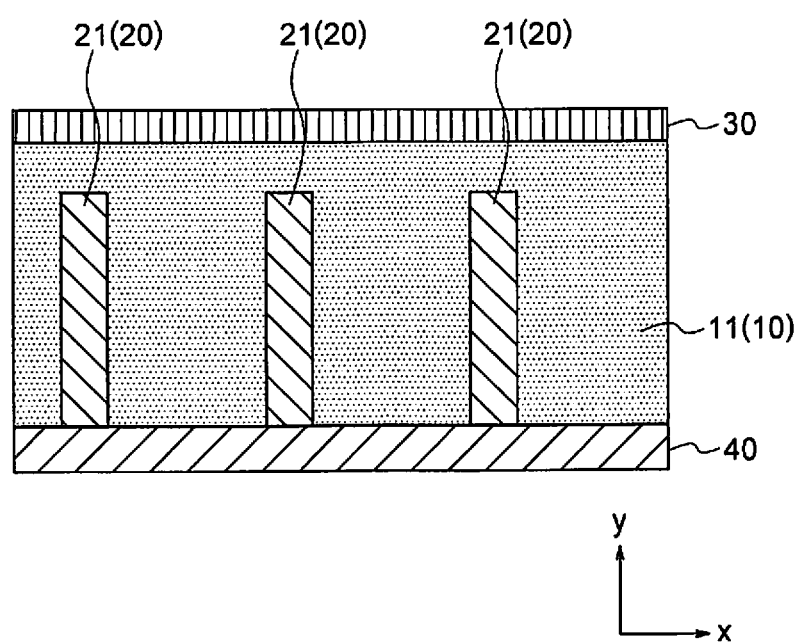
FIG. 8 is a cross-sectional view of a photovoltaic device according to a modified example.

As a modified example of this embodiment, the photovoltaic device may be configuration to include only one of the dissociation regions 21 or the dissociation regions 22. FIG. 8 is a cross-sectional view of the photovoltaic device having the dissociation regions 21, and FIG. 9 is a cross-sectional view of the photovoltaic device having the dissociation regions 22.

The distal end portions of the dissociation regions 21 are not connected to the anode electrode 30 and are covered with the organic material, as illustrated in FIG. 8. The end portions of the dissociation regions 21 positioned opposite to the distal end portions, on the other hand, are directly connected to the cathode electrode 40 and are also covered with the organic material.

Figure 9:
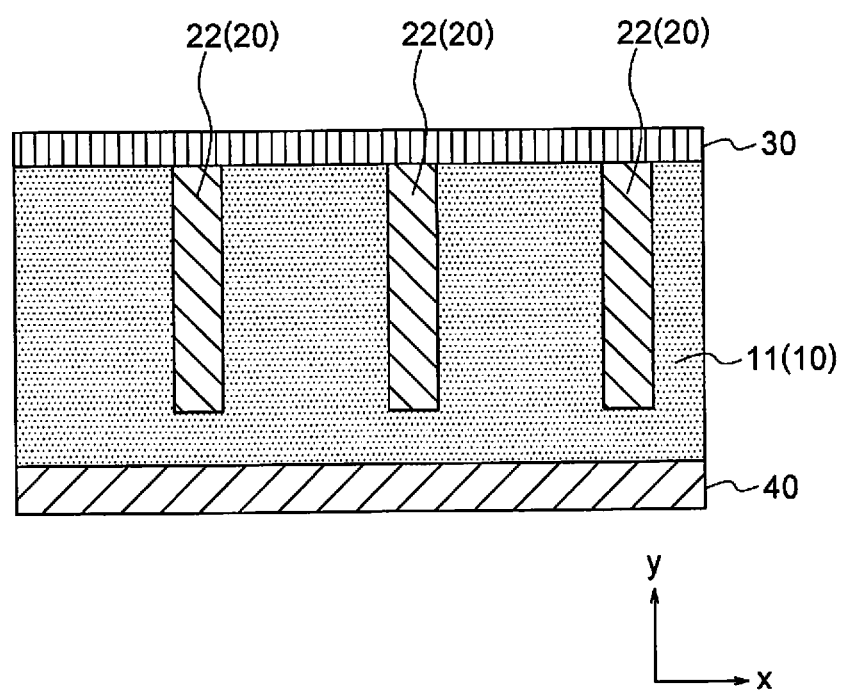
FIG. 9 is a cross-sectional view of the photovoltaic device according to a modified example.

The distal end portions of the dissociation regions 22 are not connected to the cathode electrode 40 and are covered with the organic material, as illustrated in FIG. 9. The end portions of the dissociation regions 22 positioned opposite to the distal end portions, on the other hand, are directly connected to the anode electrode 30 and are also covered with the organic material.

In this embodiment according to the modified example, since the carriers are extracted from the inorganic semiconductor that has a long diffusion length, efficient carrier extraction is possible. In addition, the film thickness of the photoactive region 11, which was restricted by the diffusion length, can be increased up to about the diffusion length of the dissociation region 21.

Third Embodiment

Figure 10:
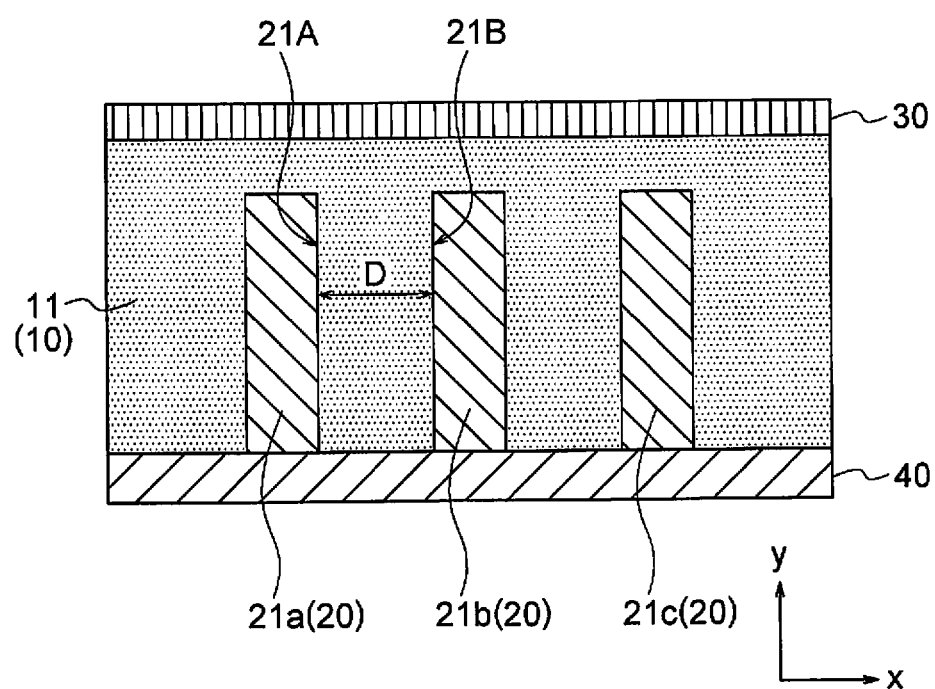
FIG. 10 is a cross-sectional view of the photovoltaic device according to another embodiment.

FIG. 10 is a cross-sectional view of the photovoltaic device according to another embodiment. This embodiment is different from the first embodiment in the length of the intervals between the plurality of the dissociation regions 21. The other configurations are the same as the above-described first embodiment, and the descriptions thereof are incorporated by reference.

The dissociation region 21a faces the dissociation region 21b across the organic semiconductor 10 in the x direction, as is illustrated in FIG. 10. An opposing surface 21A and an opposing surface 21B are arranged such that the surfaces thereof face each other across a distance D. The opposing surface 21A is the surface of the dissociation region 21a that faces the dissociation region 21b. The opposing surface 21B is the surface of the dissociation region 21b that faces the dissociation region 21a. The opposing surfaces 21A, 21B are surfaces along the direction of extension (y direction) of the dissociation regions 21a, 21b. The distance D is within twice the diffusion length of the excitons.

The diffusion length of the organic semiconductor is from several nm to about 20 nm in many materials. The excitons generated in the organic semiconductor 10 diffuse to the left and right with a length equivalent to the diffusion length. That is, if the donor-acceptor interface (p-n interface) does not exist in an interval of within twice the diffusion length, the electrons and holes of the excitons will recombine, causing energy loss.

In this embodiment, the dissociation regions 21a, 21b are arranged such that the distance D is within twice the diffusion length of the excitons. It is thereby possible to increase the dissociation efficiency of the excitons while suppressing the recombination of excitons.

Fourth Embodiment

Figure 11:
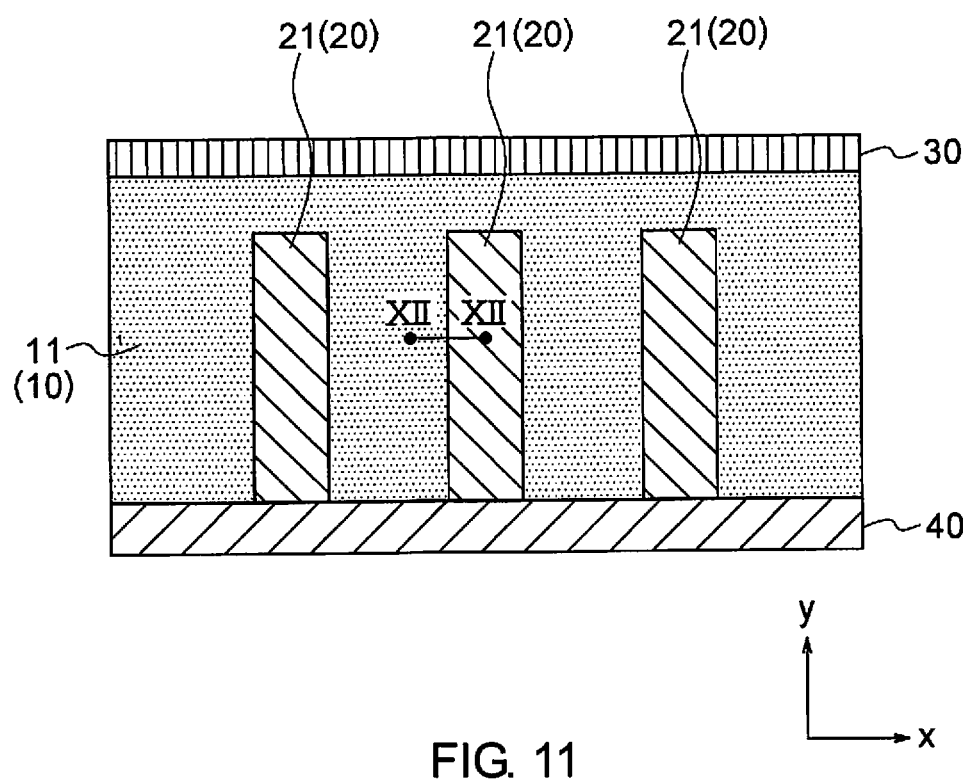
FIG. 11 is a cross-sectional view of the photovoltaic device according to another embodiment.
Figure 12:
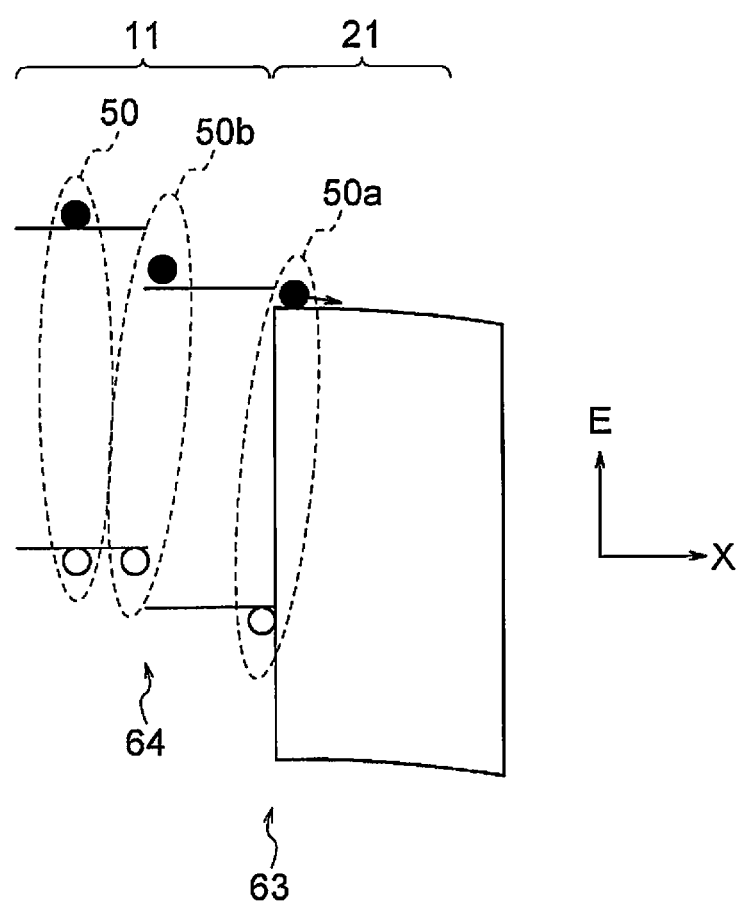
FIG. 12 is an energy diagram in a cross section taken through line XII-XII of FIG. 11.

FIG. 11 is a cross-sectional view of the photovoltaic device according to another embodiment. FIG. 12 is an energy diagram in a cross section taken through line XII-XII of FIG. 11. The horizontal axis (X) in FIG. 12 indicates the same position as the x axis in FIG. 11, and the vertical axis (E) represents the energy magnitude. This embodiment differs from the first embodiment in the configuration of the photoactive region 11. The other configurations are the same as the above-described first embodiment, and the descriptions of the first to the third embodiments are incorporated where appropriate.

In the photovoltaic device according to this embodiment, the photoactive region 11 is formed by mixing an organic semiconductor donor (p-type) and an organic semiconductor acceptor (n-type) to form a bulk heterojunction in which the donor-acceptor interface is distributed over the entire region. The interface 63 is an interface between the photoactive region 11 and the dissociation regions 21. The interface 64 is a bulk heterojunction interface in the photoactive region 11.

As shown in FIG. 12, of the plurality of excitons 50 generated by receiving light, an exciton 50a reaches the interface 63 and dissociates. The exciton 50b that is not directed toward the interface 63 reaches the interface 64 and is thereby dissociated. It is thus possible to increase the conversion efficiency.

As described above, in this embodiment, the photoactive region includes the bulk heterojunction. As a result, the excitons that have not been directed toward the interface 63 between the photoactive region 11 and the dissociation regions 21 reach the interface 64 existing in the bulk heterojunction, whereby the excitons are dissociated. Thus, the conversion efficiency can be enhanced.

Fifth Embodiment

Figure 13:
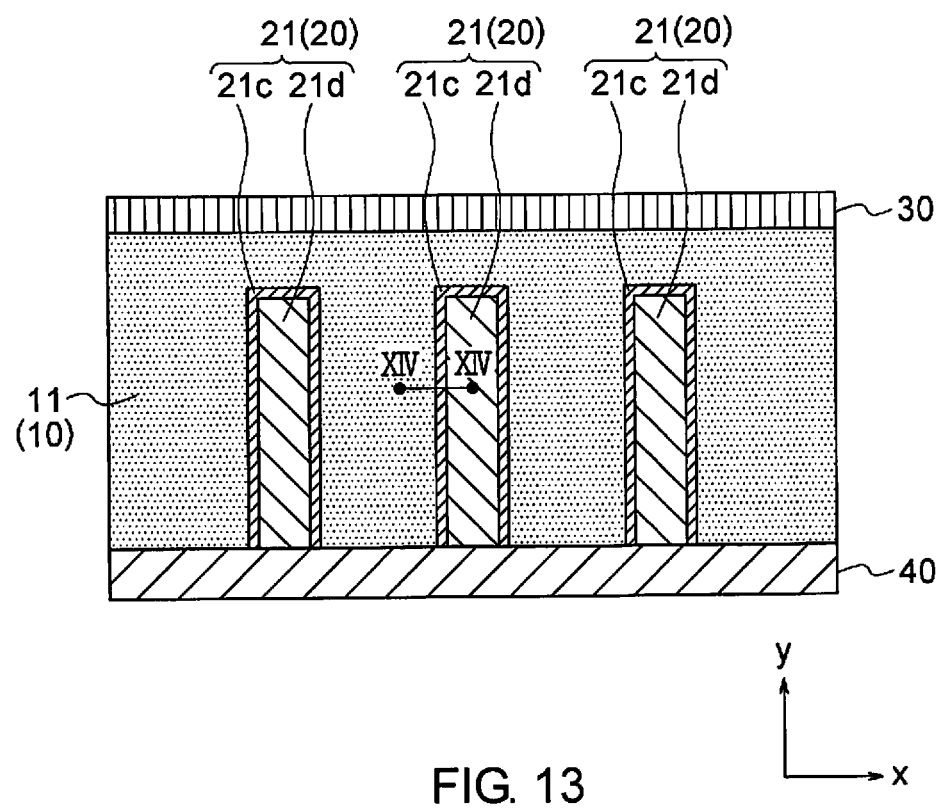
FIG. 13 is a cross-sectional view of the photovoltaic device according to another embodiment.
Figure 14:
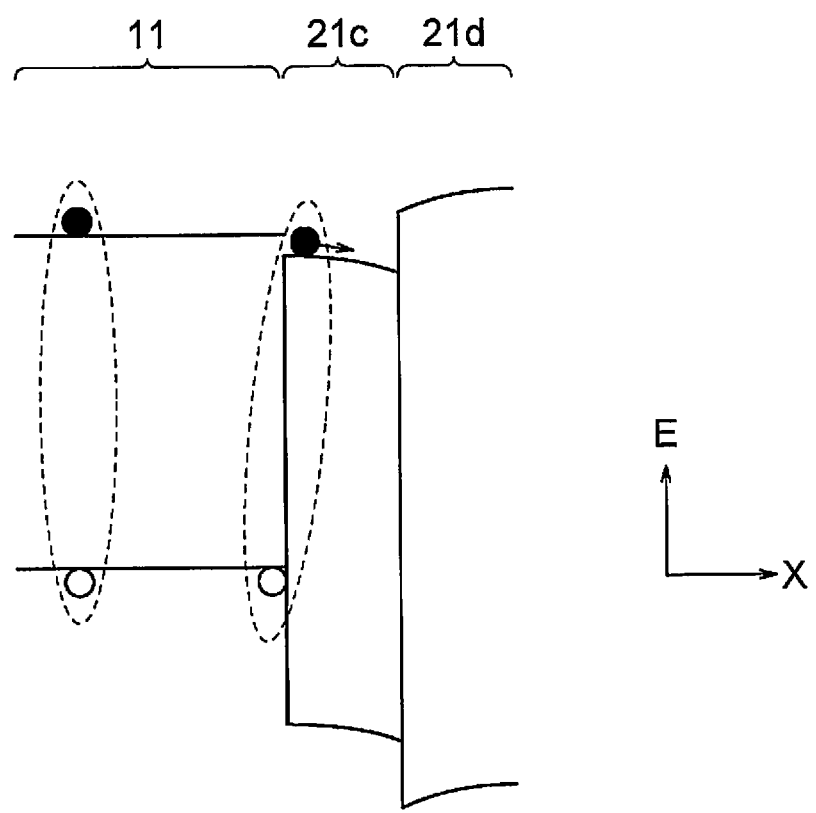
FIG. 14 is an energy diagram in a cross section taken through line XIV-XIV of FIG. 13.

FIG. 13 is a cross-sectional view of the photovoltaic device according to another embodiment. FIG. 14 is an energy diagram in a cross section taken through line XIV-XIV of FIG. 13. The horizontal axis (X) in FIG. 14 indicates the same position as the x axis in FIG. 13, and the vertical axis (E) represents energy magnitude. This embodiment differs from the first embodiment in the configuration of the dissociation regions 21. The other configurations are the same as the above-described first embodiment, and the descriptions of the first to the fourth embodiments are incorporated where appropriate.

The dissociation regions 21 according to this embodiment are formed from two types of materials having different lattice constants. The dissociation regions 21 includes a dissociation layer 21c formed from a first type of material and a dissociation layer 21d formed from a second type of material. The dissociation layer 21c is formed in a columnar shape. The dissociation layer 21d is formed so as to cover the outer periphery of the dissociation layer 21c. There may be three or more types of materials included in the dissociation regions 21.

The combination of the material of the dissociation layer 21c and the material of the dissociation layer 21d is at least one selected from AlN/AlGaN, AlGaN/GaN, GaN/InGaN, InGaN/InN, AlAs/AlGaAs, AlGaAs/GaAs, GaAs/InGaAs, InGaAs/InAs, AlP/AlGaP, AlGaP/GaP, GaP/GaAsP, GaAsP/GaAs, AlP/AlAsP, AlAsP/AlAs, AlAs/InAlAs, InAlAs/InAs, GaAs/GaAsSb, GaAsSb/GaSb, AlSb/AlGaSb, AlGaSb/GaSb, AlSb/AlInSb, AlInSb/InSb, MgS/MgZnS, MgZnS/ZnS, MgS/MgSSe, MgSSe/MgSe, ZnS/ZnSSe, ZnSSe/ZnSe, MgSe/MgZnSe, MgZnSe/ZnSe, CuAIS$_2$/CuAISSe, CuAISSe/CuAISe$_2$, CuAIS$_2$/CuGaAIS$_2$, CuGaAIS$_2$/CuGaAIS$_2$, CuGaS$_2$/CuGaSSe, CuGaSSe/CuGaSe$_2$, CuGaS$_2$/CuInGaS$_2$, CuInGaS$_2$/CuInS$_2$, CuInS$_2$/CuInSSe, CuInSSe/CuInSe$_2$, CuGaSe$_2$/CuInGaSe$_2$, CuInGaSe$_2$/CuInSe$_2$, MgSe/MgZnSeTe, and MgZnSeTe/ZnTe.

When sunlight heats a solar cell, an electric field is generated by the stress-strain caused by the difference in the thermal expansion coefficient of each material contained in the inorganic piezoelectric material. However, in the method that uses sunlight, the magnitude of the stress that acts on the piezoelectric material will vary with the amount of solar radiation and the ambient temperature, so that stable solar cell characteristics cannot be obtained.

In this embodiment, because the dissociation regions 21 are formed from two types of materials having different lattice constants, stress-strain acts, and the electric field is generated due to the piezoelectric effect (piezoelectric field effect). As a result, it is possible to stably generate the electric field without restriction from materials selection and sunlight conditions.

As described above, in this embodiment, the dissociation regions 21 have a plurality of layers 21c, 21d formed from mutually different materials, and the lattice constants of the different materials are different. Since stress-strain is generated between the materials with different lattice constants, it is possible to stably generate the electric field in the dissociation regions 21.

In addition, the plurality of the materials that form the dissociation regions 21 are selected from the combinations described above. Thus, because materials with similar compositions are used, it is possible to form a stacked structure of inorganic materials.

The dissociation regions 21 may be formed from the same materials having different composition ratios as a modified example of the photovoltaic device according to this embodiment. That is, the combinations of the materials that form the dissociation regions 21 is at least one selected from Al$_x$Ga$_{1-x}$N/Al$_y$Ga$_{1-y}$N (x≠y), In$_x$Ga$_{1-x}$N/In$_y$Ga$_{1-y}$N (x≠y), AlGa$_x$As$_{1-x}$/AlGa$_y$As$_{1-y}$ (x≠y), In$_x$Ga$_{1-x}$As/In$_y$Ga$_{1-y}$As, AlGa$_x$P$_{1-x}$/AlGa$_y$P$_{1-y}$ (x≠y), GaAS$_x$P$_{1-x}$/GaAs$_y$P$_{1-y}$ (x≠y), AlAs$_x$P$_{1-x}$/AlAs$_y$P$_{1-y}$ (x≠y), In$_x$Al$_{1-x}$As/In$_y$Al$_{1-y}$As (x≠y), GaAs$_x$Sb$_{1-x}$/GaAs$_y$Sb$_{1-y}$ (x≠y), Al$_x$Ga$_{1-x}$Sb/AlyGa$_{1-y}$Sb (x≠y), Al$_x$In$_{1-x}$Sb/Al$_y$In$_{1-y}$Sb (x≠y), Mg$_x$Zn$_{1-x}$S/Mg$_y$Zn$_{1-y}$S (x≠y), Mg$_x$Zn$_{1-x}$Se/Mg$_y$Zn$_{1-y}$Se (x≠y), CuAl(S$_x$Se$_{1-x}$)$_2$ (x≠y), CuAl$_x$Ga$_{1-x}$S$_2$/CuAl$_y$Ga$_{1-y}$S$_2$ (x≠y), CuGa(S$_x$Se$_{1-x}$)$_2$/CuGa(S$_y$Se$_{1-y}$)$_2$ (x≠y), CuIn$_x$Ga$_{1-x}$S$_2$/CuIn$_y$Ga$_{1-y}$S$_2$ (x≠y), CuIn(S$_x$Se$_{1-x}$)$_2$/CuIn(S$_y$Se$_{1-y}$)$_2$ (x≠y), CuInGa$_{1-x}$Se$_2$/CuIn$_y$Ga$_{1-y}$Se$_2$ (x≠y) and (MgSe)$_x$ (ZnTe)$_{1-x}$/(MgSe)$_y$ (ZnTe)$_{1-y}$ (x≠y), where 0<x<1 and 0<y<1. Because the same materials are used for the dissociation regions 21, it is possible to reduce manufacturing costs. In addition, because the combination of E$_C$ and E$_V$ can be freely selected within the range of the composition ratio, material selection is not restricted.

The adjustment of the energy level at the interface will now be described. The E$_C$ and E$_V$ of the inorganic semiconductor 20 are intrinsic energy levels that are determined by the material and the crystallinity thereof. Thus, matching the energy of the inorganic semiconductor to a specific organic semiconductor material is difficult since it entails changing the material of the inorganic semiconductor. In some compound semiconductors, E$_C$ and E$_V$ can be adjusted by changing the compositions during crystal growth of the semiconductor. For example, E$_C$ and E$_V$ can be controlled by adjusting the Al/Ga composition ratio in AlGaN and the In/Ga composition ratio in InGaN. In addition, multi-element compound semiconductors in which the band gap can be adjusted, such as Al—In—Ga—N semiconductors and Al—In—Ga—As semiconductors often have piezoelectric properties. In addition, since it is possible to change the lattice constant of the crystal with the composition, it is possible to exhibit the piezoelectric effect (piezoelectric field effect) by means of a two-layer structure of different compositions and to form the electric field required for dissociating the excitons.

Sixth Embodiment

Figure 15:
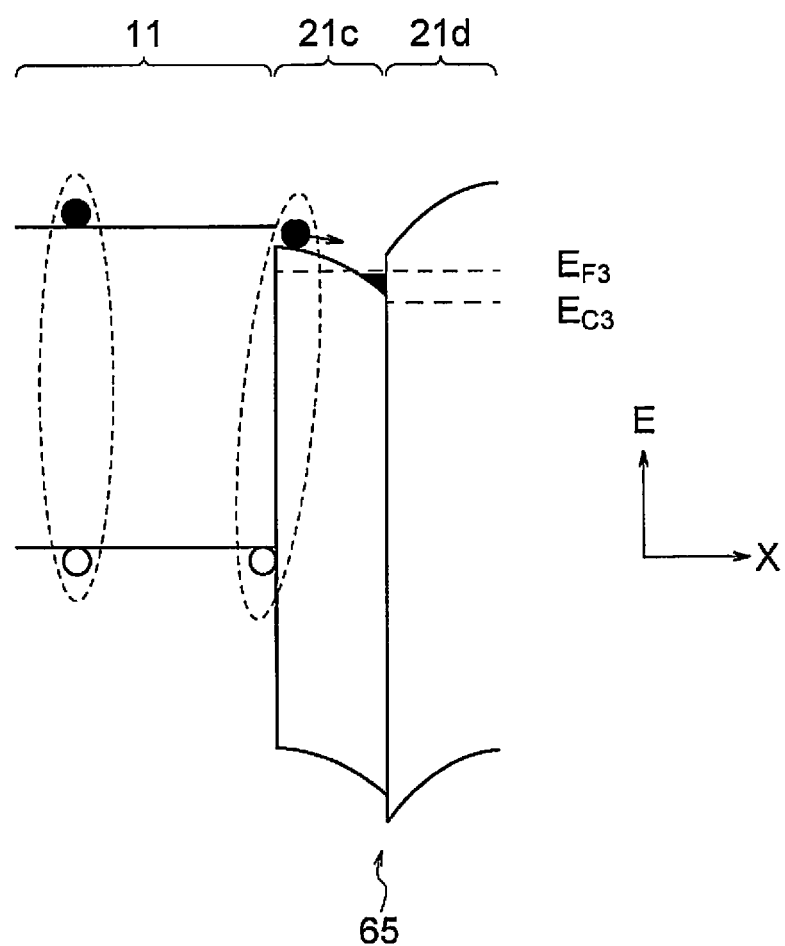
FIG. 15 is an energy diagram of the photovoltaic device according to another embodiment.

FIG. 15 is an energy diagram of the photovoltaic device according to another embodiment. FIG. 15 is an energy diagram in a cross section taken through line XIV-XIV of FIG. 13. The horizontal axis (X) in FIG. 15 indicates the same position as the x axis in FIG. 13 and the vertical axis (E) represents the energy magnitude. This embodiment differs from the fifth embodiment described above in the relationship of the energy levels in the dissociation regions 21. The other configurations are the same as the above-described fifth embodiment, and the descriptions of the first to the fifth embodiments are incorporated where appropriate.

The dissociation regions 21 include a plurality of the dissociation layers 21c, 21d. The relationship of the energy levels between the dissociation layer 21c and the dissociation layer 21d at the interface 65 satisfies the following equation (13):

$$E_{C3} < E_{F3} \tag{13}$$

where, E$_{C3}$ represents the energy level of the lower end of the conduction band of the dissociation layer 21c, and E$_{F3}$ represents the Fermi level of the dissociation layer 21c.

The stress-strain increases in the dissociation regions 21 due to an increase in the lattice mismatch ratio, and the piezoelectric field increases. When the piezoelectric field increases and the energy level E$_{C3}$ at the lower end of the conduction band becomes lower than the Fermi level E$_{F3}$, a two-dimensional electron gas is formed at the interface 65 (the darkened portion in FIG. 15). In the region of the two-dimensional electron gas, since the conductivity can be ensured without carrying out impurity doping or the like, the scattering of carriers by impurities can be suppressed and carrier mobility improved. Therefore, by satisfying the equation (13) above, the diffusion length can be increased.

As described above, in this embodiment, the dissociation regions 21 have a plurality of layers 21c, 21d formed from different materials, and the energy level of one of the plurality of layers 21c, 21d satisfies the equation (13). As a result, because the carriers are extracted via the two-dimensional electron gas with high mobility, it is possible to increase the diffusion length. In addition, it is possible to efficiently extract the carriers and to increase the thickness of the photoactive region 11.

In this embodiment, the dissociation regions 21 may be connected to the anode electrode 30 instead of the cathode electrode 40, and at the interface 65 between the dissociation layer 21c and the dissociation layer 21d, the relationship of the energy levels may satisfy the following equation (14):

$$E_{V3} > E_{F3} \tag{14}$$

where E$_{V3}$ represents the energy level of the upper end of the valence band of the dissociation layer 21c.

As a result, because the carriers are extracted via the two-dimensional hole gas with high mobility, it is possible to increase the diffusion length. In addition, it is possible to efficiently extract the carriers and to increase the thickness of the photoactive region 11.

Seventh Embodiment

Figure 16:
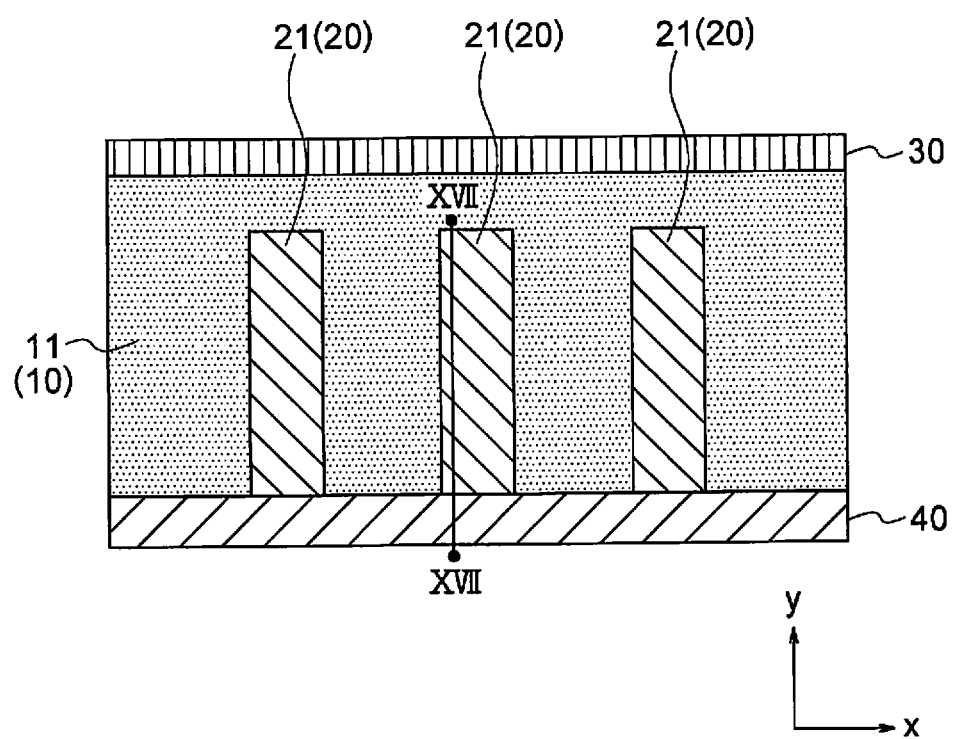
FIG. 16 is a cross-sectional view of the photovoltaic device according to another embodiment.
Figure 17:
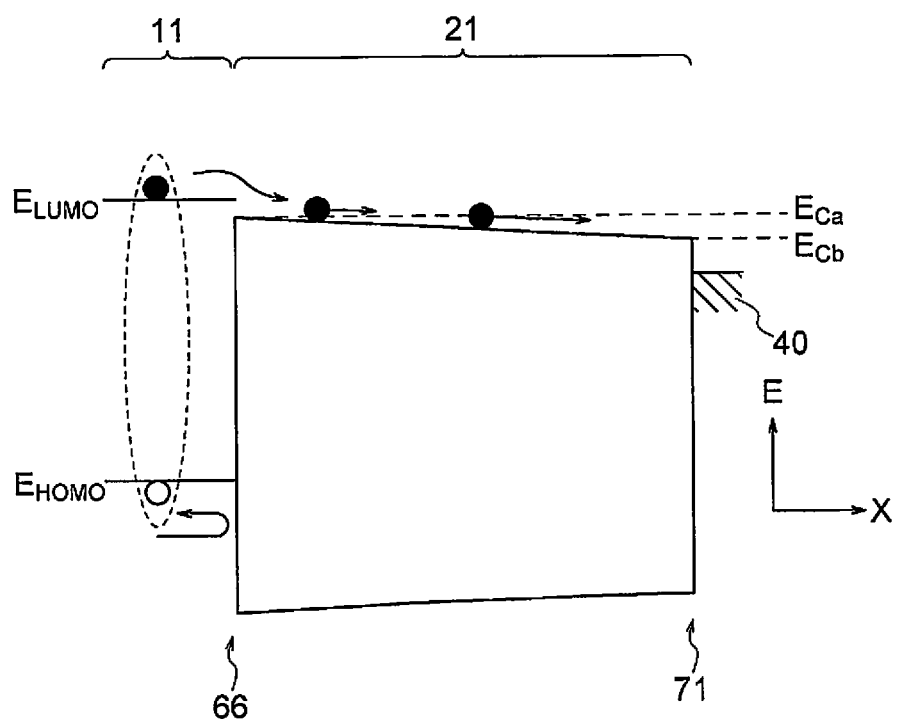
FIG. 17 is an energy diagram in across section taken through line XVII-XVII of FIG. 16.

FIG. 16 is a cross-sectional view of the photovoltaic device according to another embodiment. FIG. 17 is an energy diagram in a cross section taken through line XVII-XVII of FIG. 16. The horizontal axis (X) in FIG. 17 indicates the same position as the x axis in FIG. 16, and the vertical axis (E) represents the energy magnitude. This embodiment differs from the fifth embodiment described above in the relationship of the energy levels in the dissociation regions 21. The other configurations are the same as the above-described first embodiment, and the descriptions of the first to the sixth embodiments are incorporated where appropriate.

The relationship of the energy levels at an interface 71 between the dissociation regions 21 and the electrode 40 will now be described. If the LUMO energy level of the photoactive region 11 is $E_{LUMO}$, the energy level at the lower end of the conduction band of the dissociation regions 21 at an interface 66 is $E_{Ca}$, and the energy level at the lower end of the conduction band of the dissociation regions 21 at a connection surface 71 is $E_{Cb}$, the relationship between each of the energy levels can be represented by the following equations (15) and (16):

$$E_{LUMO} > E_{Ca} \tag{15}$$

$$E_{Ca} - E_{Cb} \leq 0.3 \text{ [eV]} \tag{16}$$

In addition, the energy level at the lower end of the conduction band between the interface 66 and the connection surface 71 decreases monotonically from the interface 66 toward the connection surface 71. In other words, in a state in which the energy level $E_{Ca}$ is lower than the energy level $E_{Cb}$, the inclination of the energy level at the lower end of the conduction band in the dissociation regions is a gradual inclination, as illustrated in FIG. 17.

When a multi-element mixed-crystal material, such as AlGaN, InGaN, AlGaAs, InGaAs, GaAsP, and InGaAs, is used as the material of the semiconductor, it is possible to adjust the size of the band gap of the semiconductor by changing the composition ratio. The composition ratio can be adjusted by adjusting a growth parameters during crystal growth, such as temperature, pressure, and source gas ratio. Then, the energy of the lower end $E_C$ of the conduction band with respect to the position can be continuously decreased by continuously adjusting the composition ratio of the crystal. Here, the inclination of $E_C$ is the electric field strength, and the electrons 51 can obtain a thrust force oriented toward the cathode electrode 40 by the electrons 51 receiving the force of the electric field. Therefore, it is possible to extend the diffusion length.

If the slope of the energy level at the lower end of the conduction band in the dissociation region is increased between the interface 66 and the connection surface 71, the amount of potential decrease that corresponds to the integration of the slope portion becomes large, and there is the risk that the output power of the photovoltaic device will be low. In this embodiment, the potential decrease amount due to the inclination of the energy level can be suppressed to 0.3 eV or less by means of the energy level condition satisfying equation (16). As a result, it is possible to minimize the voltage loss while preventing the reverse flow of carriers.

As described above, in this embodiment, the energy level at the interface 66 and the energy level at the connection surface 71 satisfy the equation (16). It is thereby possible to suppress the voltage loss while preventing the reverse flow of the carriers.

In addition, in this embodiment, the energy level at the lower end of the conduction band between the interface 66 and the connection surface 71 decreases monotonically from the interface 66 toward the connection surface 71. It is thereby possible for the carriers to obtain a thrust force oriented toward the desired electrode by generating the electric field in the dissociation regions 21. As a result, it is possible to extend the diffusion length.

In this embodiment, the dissociation regions 21 may be connected to the anode electrode 30 instead of the cathode electrode 40, and the energy level at the interface 66 and the energy level at the connection surface 71 may satisfy the following equations (17) and (18) instead of equations (15) and (16):

$$E_{HOMO} < E_{Va} \tag{17}$$

$$E_{Vb} - E_{Va} \leq 0.3 \text{ [eV]} \tag{18}$$

It is thereby possible to suppress the voltage loss while preventing the reverse flow of carriers.

In addition, in this embodiment, the energy level at the upper end of the valence band between the interface 66 and the connection surface 71 increases monotonically from the interface 66 toward the connection surface 71. The connection surface 71 is the connection surface between the anode electrode and the dissociation regions 21 connected to the anode electrode 30. It is thereby possible for the carriers to obtain a thrust force oriented toward the desired electrode by generating the electric field in the dissociation regions 21. As a result, it is possible to extend the diffusion length.

Eighth Embodiment

Figure 18:
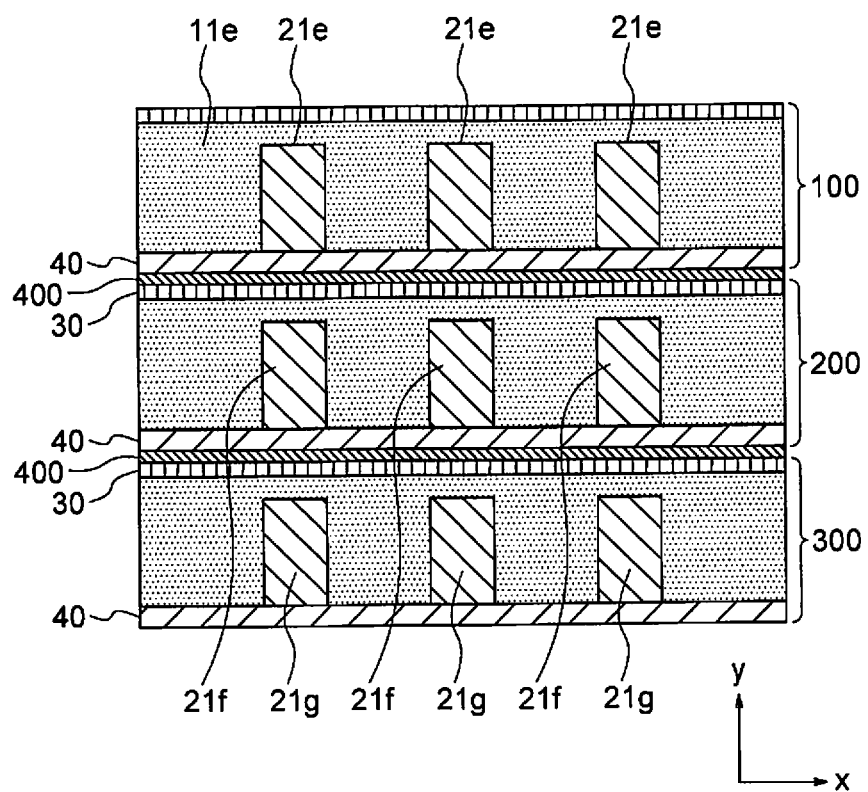
FIG. 18 is a cross-sectional view of the photovoltaic device according to another embodiment.

FIG. 18 is a cross-sectional view of the photovoltaic device according to another embodiment. The photovoltaic device according to this embodiment is configured as a tandem type. The other configurations are the same as the above-described first embodiment, and the descriptions of the first to the seventh embodiments are incorporated where appropriate.

As shown in FIG. 18, the photovoltaic device is configured as a triple-junction tandem cell. The photovoltaic device comprises a top cell 100, a middle cell 200, a bottom cell 300, and tunnel recombination layers 400. The top cell 100 includes the organic semiconductor 10, the inorganic semiconductors 20, the anode electrode 30, and the cathode electrode 40. The organic semiconductor 10 included in the top cell 100 has a photoactive region 11e. The inorganic semiconductors 20 included in the top cell 100 has dissociation regions 21e.

The middle cell 200 includes the organic semiconductor 10, the inorganic semiconductors 20, the anode electrode 30, and the cathode electrode 40. The organic semiconductor 10 included in the middle cell 200 has a photoactive region 11f. The inorganic semiconductors 20 included in the middle cell 200 has dissociation regions 21f.

The bottom cell 300 includes the organic semiconductor 10, the inorganic semiconductors 20, the anode electrode 30, and the cathode electrode 40. The organic semiconductor 10 included in the bottom cell 300 has a photoactive region 11g. The inorganic semiconductors 20 included in the bottom cell 300 has dissociation regions 21g.

The top cell 100, the middle cell 200, and the bottom cell 300 are stacked in a normal direction (y direction in FIG. 18) of the electrode surfaces of the anode electrode 30 and the cathode electrode 40. Since the configuration of each of the top cell 100, the middle cell 200, and the bottom cell 300 is the same as that of the semiconductor device according to the first embodiment, the descriptions thereof are omitted.

The tunnel recombination layer 400 couples the cathode electrode 40 included in the top cell 100 and the anode electrode 30 included in the middle cell 200, and couples the cathode electrode 40 included in the middle cell 200 and the anode electrode 30 included in the bottom cell 300.

The direction of light incidence is the direction from the anode electrode 30 of the top cell 100 toward the cathode electrode of the bottom cell 300 (negative direction of the y axis). The photoactive region 11e, the photoactive region 11f, and the photoactive region 11g each have different band gaps, which become smaller along the stacking direction of the cells, from the light-incident surface. That is, among the respective band gaps of the photoactive region 11e, the photoactive region 11f, and the photoactive region 11g, the band gap on the light-incident side is greatest and sequentially decreases in the transmission direction of the band gap light.

The basic concept of tandem solar cells is utilization of the fact that the semiconductor absorbs light higher in energy than the band gap and transmits light lower in energy than the band gap. When the energy that the carriers, which are generated by the semiconductor, etc. absorbing light, receive from the photons is greater than the band gap, the energy of the photons hv−Eg (h: Planck's constant, v: wave number of photons, Eg: band gap) is lost due to relaxation of the carriers. By stacking materials that have a plurality of band gaps and causing the light to enter and transmit in descending order of the band gaps, it is possible to suppress losses due to relaxation of each of the wavelength bands. As a result, a solar cell that exceeds the Shockley-Queisser limit becomes theoretically possible.

Even with organic semiconductors, it becomes possible to adjust the absorption end of the light and to change the size of the band gap by, for example, selecting the material or adjusting the functional group. It is possible to suppress the loss in each wavelength band and to further improve the conversion efficiency, for example, by using organic materials that display absorption spectra that are respectively suitable for the top cell 100, the middle cell 200, and the bottom cell 300 of a triple-junction tandem solar cell.

As described above, this embodiment is provided with a stacked body in which a plurality of cells 100, 200, 300 are stacked, and the band gap of each of the photoactive regions 11e, 11f, 11g included in the plurality of stacked cells 100, 200, 300 becomes smaller from the incident-light surface along the stacking direction of the cells. As a result, it is possible to suppress the loss in each wavelength band by using organic materials that exhibit absorption spectra that are suitable for each cell of the tandem solar cell. As a result, it becomes possible to improve the conversion efficiency.

In this embodiment, among the respective band gaps of the dissociation regions 21e, the dissociation regions 21f, and the dissociation regions 21g, the band gap on the light-incident side is greatest and sequentially decreases in the transmission direction of the band gap light proceeds in the transmission direction. At this time, the dissociation regions 21e, the dissociation regions 21f, and the dissociation regions 21g have the function of the photoactive region. That is, among the respective band gaps of the dissociation regions 21e, the dissociation regions 21f, and the dissociation regions 21g, the band gap on the light-incident side is the greatest and sequentially decreases in the transmission direction of the band gap light. As a result, it is possible to suppress the loss in each wavelength band by using inorganic materials that exhibit absorption spectra that are suitable for each cell of the tandem solar cell. As a result, it becomes possible to improve the conversion efficiency.

Ninth Embodiment

Figure 19:
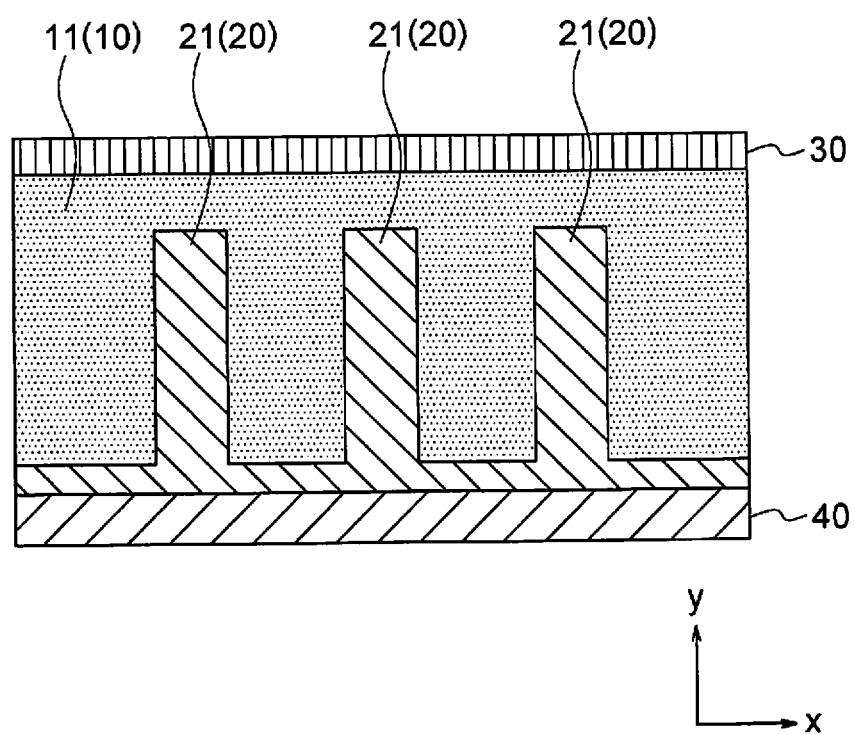
FIG. 19 is a cross-sectional view of the photovoltaic device according to another embodiment.

FIG. 19 is a cross-sectional view of the photovoltaic device according to another embodiment. The photovoltaic device according to this embodiment is different in the configuration of a part of the inorganic semiconductor 20. The other configurations are the same as the above-described first embodiment, and the descriptions of the first to the eighth embodiments are incorporated where appropriate. The direction of light incidence is the direction from the anode electrode 30 toward the cathode electrode 40 (negative y-axis direction).

The inorganic semiconductor 20 is formed to cover the surface of the cathode electrode 40. Portions of the inorganic semiconductor 20 have a columnar shape, and the columnar portions are covered with the organic material of the organic semiconductor 10. Since the cathode electrode 40 is covered with the inorganic semiconductor 20, the organic semiconductor 11 and the cathode electrode 40 are not in direct contact with each other. That is, the film-like inorganic semiconductor 20 is provided between the cathode electrode and the end of the organic semiconductor 11.

The inorganic semiconductor 20 is formed by crystal growth, such as CVD. Crystals of an inorganic material are grown on the surface of the plate-like cathode electrode 40 and growth is temporarily suspended when a film of the inorganic material is formed on the surface of the cathode electrode 40.

A mask pattern, such as a photolithography mask, is placed on the inorganic material film. Columnar crystals of the same inorganic material are grown at the openings of the mask pattern. The inorganic semiconductor 20 is thereby formed, as illustrated in FIG. 19.

The method for producing the inorganic semiconductor 20 is not limited to crystal growth, such as CVD, and the S-K growth (Stranski-Krastanov) mode may be used instead. When the S-K growth mode is used, of the inorganic material film that is formed on the surface of the cathode electrode 40, only a portion of the surface of the inorganic material film need e grown in columnar form. In the inorganic semiconductor 20, piezoelectric material may be grown to the height of the columnar portions shown in FIG. 19 (height in the y direction), and the portions other than the columnar portions (recessed region) may be formed by etching.

As described above, in this embodiment, the dissociation regions 21 are surrounded by the organic material of the organic semiconductor 10, and a part of the dissociation regions 21 are directly connected to the cathode electrode 40, while the cathode electrode and the photoactive region 11 are not in direct contact.

Unlike this embodiment, if the organic semiconductor 10 and the cathode electrode 40 are in direct contact, a localized energy level is formed at the interface between the organic semiconductor 10 and the cathode 40, depending on the combination of the organic material of the organic semiconductor 10 and the material of the cathode electrode 40. If the localized energy level is a level that promotes carrier recombination, a dipole (electric dipole) is formed at the interface, thereby making it difficult to obtain the desired characteristics.

In this embodiment, because the organic semiconductor 10 and the cathode electrode 40 are not in direct contact, a localized energy level that promotes carrier recombination is not generated, and formation of the dipole at the interface can be prevented.

Figure 20:
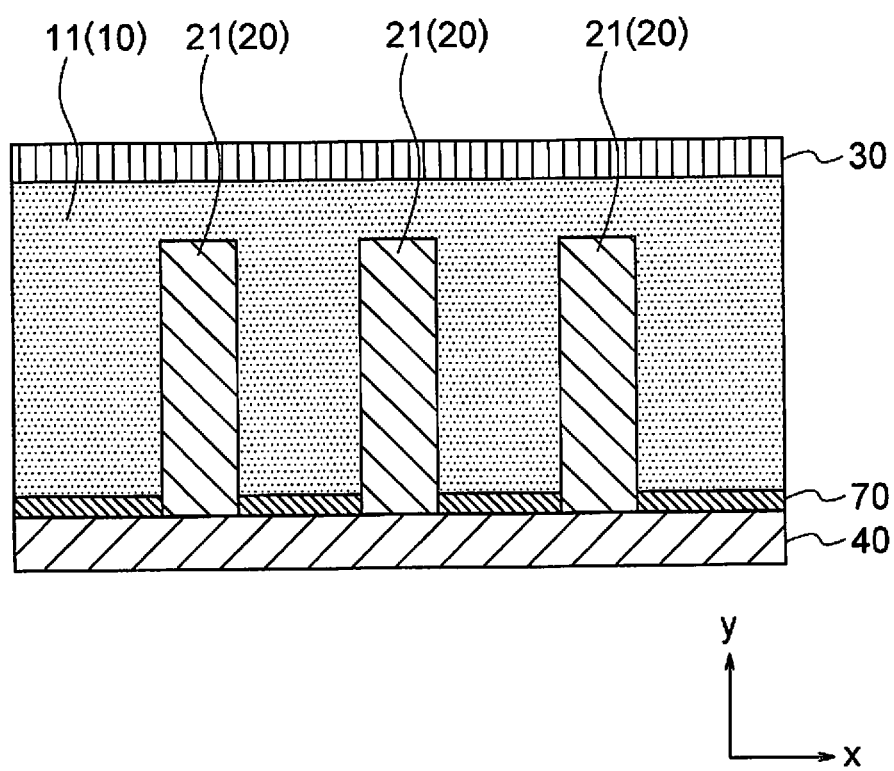
FIG. 20 is a cross-sectional view of the photovoltaic device according to a modified example.

The photovoltaic device according to this embodiment may have the structure shown in FIG. 20 as a structure in which the organic semiconductor 10 and the cathode electrode 40 are not in direct contact with each other.

FIG. 20 is a cross-sectional view of the photovoltaic device according to a modified example of this embodiment. The photovoltaic device according to the present modified example comprises the organic semiconductor 10, the inorganic semiconductor 20, the anode electrode 30, the cathode electrode 40, and a protective film 70. The protective film 70 is provided between the organic semiconductor 10 and the cathode electrode 40. The protective film 70 is formed on the surface of the cathode electrode 40 so as to cover the portion of the surface of the cathode electrode 40 that is not connected to the dissociation regions 21. The protective film 70 may have an insulating property. The protective film 70 is formed of an oxide film obtained by oxidizing a metal surface or by means of a growth method (CVD, etc.). After forming the protective layer on the surface of the cathode electrode 40, the portion where the dissociation regions 21 are to be formed are opened by means of photolithography. The dissociation regions 21 are formed by crystal growth of the inorganic material at the opened portions.

Figure 21:
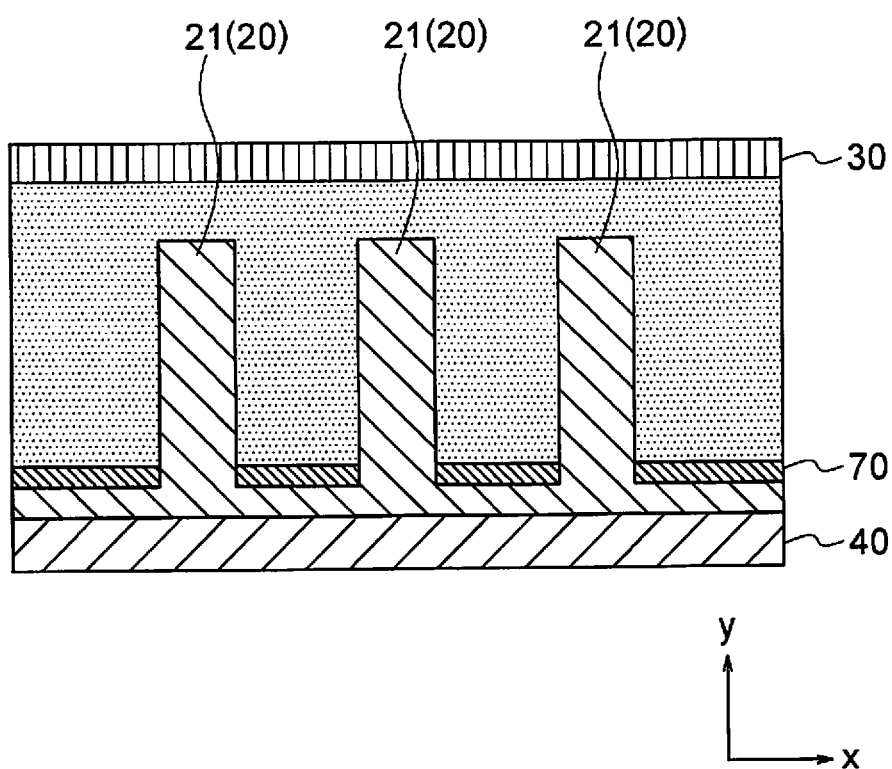
FIG. 21 is a cross-sectional view of the photovoltaic device according to a modified example.

The photovoltaic device according to this embodiment may have the structure shown in FIG. 21 as a structure in which the organic semiconductor 10 and the cathode electrode 40 are not in direct contact with each other. FIG. 21 is a cross-sectional view of the photovoltaic device according to a modified example of this embodiment.

In the modified example shown in FIG. 21, the inorganic semiconductors 20 are formed in a columnar shape extending in the y-axis direction, while covering the surface of the cathode electrode 40 with a layer. The columnar portions are covered with the organic material of the organic semiconductor 10. Moreover, the protective film 70 is provided between the organic semiconductor 10 and the inorganic semiconductor 20. The protective film 70 is formed so as to cover the layer portion of the inorganic semiconductor 20. The protective film 70 prevents the cathode electrode 40 and the organic semiconductor 10 from coming into direct contact with each other.

In the modified example, since it is not necessary to remove a hard mask for securing regions for growing the inorganic semiconductor 20, the manufacturing process can be simplified.

The invention claimed is:

1. A photovoltaic device comprising:
an organic semiconductor including a photoactive region for generating excitons; and
an inorganic semiconductor with piezoelectricity including a dissociation region for dissociating carriers included in the excitons;
the dissociation region having a plurality of layers formed of mutually different materials and being a region in which strain is generated due to a difference in lattice constants of the different materials, and wherein
a relationship of energy levels between the photoactive region and the dissociation region satisfies at least one of the following equations (1) or (2):

$$E_{LUMO} > E_C \quad (1),$$

$$E_{HOMO} < E_V \quad (2),$$

where
$E_{LUMO}$ represents an LUMO energy level in the photoactive region,
$E_{HOMO}$ represents an HOMO energy level in the photoactive region,
$E_C$ represents the energy level at a lower end of a conduction band in the dissociation region, and
$E_V$ represents the energy level of an upper end of a valence band in the dissociation region.

2. The photovoltaic device according to claim 1, wherein when the relationship of the energy levels satisfies the equation (1), the relationship of the energy levels also satisfies $E_{LUMO} - E_C \leq 0.3$ [eV].

3. The photovoltaic device according to claim 1, wherein when the relationship of the energy levels satisfies the equation (2), the relationship of the energy levels also satisfies $E_V - E_{HOMO} \leq 0.3$ [eV].

4. The photovoltaic device according to claim 1, wherein when the relationship of the energy levels satisfies the equation (1), the relationship of the energy levels also satisfies $E_{HOMO} - E_V \geq 0.3$ [eV].

5. The photovoltaic device according to claim 1, wherein when the relationship of the energy levels satisfies the equation (2), the relationship of the energy levels also satisfies $E_C - E_{LUMO} \geq 0.3$ [eV].

6. The photovoltaic device according to claim 1, further comprising
an electrode, wherein
the dissociation region is surrounded by an organic material that forms the organic semiconductor, and
a part of the dissociation region is directly connected to the electrode.

7. The photovoltaic device according to claim 6, wherein the energy level at an interface between the dissociation region and the photoactive region, as well as the energy level at a connection surface that is connected to the electrode,
satisfy $E_{Ca} - E_{Cb} \leq 0.3$ [eV] when the equation (1) is satisfied, and
satisfy $E_{Vb} - E_{Va} \leq 0.3$ [eV] when the equation (2) is satisfied,
where
$E_{Ca}$ represents the energy level at the lower end of the conduction band at the interface,
$E_{Va}$ represents the energy level at the upper end of the valence band at the interface,
$E_{Cb}$ represent the energy level at the lower end of the conduction band at the connection surface, and
$E_{Vb}$ represents the energy level at the upper end of the valence band at the connection surface.

8. The photovoltaic device according to claim 6, further comprising:
an electrode, wherein
the dissociation region is surrounded by the organic material that forms the organic semiconductor,
a part of the dissociation region is directly connected to the electrode,
the dissociation region and the photoactive region are coupled via an interface,
the dissociation region and the electrode are connected via a connection surface,
the energy level of the lower end of the conduction band decreases monotonically from the interface toward the connection surface, or the energy level of the upper end of the valence band increases monotonically from the interface toward the connection surface.

9. The photovoltaic device according to claim 1, further comprising
a first electrode and a second electrode, wherein
the dissociation region includes a first dissociation region through which only holes from among a plurality of carriers can pass, and a second dissociation region through which only electrons from among the carriers can pass,
the first dissociation region and the second dissociation region are surrounded by the organic material that forms the organic semiconductor,
a part of the first dissociation region is directly connected to the first electrode, and
a part of the second dissociation region is directly connected to the second electrode.

10. The photovoltaic device according to claim 1, wherein
a plurality of the dissociation regions are arranged facing each other across the organic material that forms the organic semiconductor, and
a distance between surfaces of the plurality of the dissociation regions that face each other is within twice a diffusion length of the excitons.

11. The photovoltaic device according to claim 1, wherein a material that forms the photoactive region includes at least one selected from a group comprising P3HT, P3OT, P3DDT, PTAA, MEH-PPV, MDMO-PPV, F8BT, F8T2, POT-co-DOT, p-DTS (FBTTh 2) 2, DR3TSBDT, Pd (PPh)$_4$, benzoporphyrin, tetrabenzoporphyrin, phthalocyanine, tetracene, anthracene, triphenylene, pyrene, chrysene, tetraphen, perylene, coronene, hexabenzocoronene, PDI, PDITh, PC$_{60}$BM, PC$_{61}$BM, PC$_{70}$BM, PC$_{71}$BM, PC$_{84}$BM, bis PC$_{60}$BM, PCBB, PCBO, PNTz4T, PNOz4T, ThC60BM, d5-PCBM, SIMEF, PEDOT: PSS, MADN, N719, N3, N907, YD2-o-C8, MK-1, MK-2, TA-St-CA, MR-1, MR-2, MR-3, and derivatives thereof.

12. The photovoltaic device according to claim 1, wherein the photoactive region includes a bulk heterojunction.

13. The photovoltaic device according to claim 1, wherein a combination of materials that form the dissociation region is at least one selected from AlN/AlGaN, AlGaN/GaN, GaN/InGaN, InGaN/InN, AlAs/AlGaAs, AlGaAs/GaAs, GaAs/InGaAs, InGaAs/InAs, AlP/AlGaP, AlGaP/GaP, GaP/GaAsP, GaAsP/GaAs, AlP/AlAsP, AlAsP/AlAs, AlAs/InAlAs, InAlAs/InAs, GaAs/GaAsSb, GaAsSb/GaSb, AlSb/AlGaSb, AlGaSb/GaSb, AlSb/AlInSb, AlInSb/InSb, MgS/MgZnS, MgZnS/ZnS, MgS/MgSSe, MgSSe/MgSe, ZnS/ZnSSe, ZnSSe/ZnSe, MgSe/MgZnSe, MgZnSe/ZnSe, CuAlS$_2$/CuAlSSe, CuAlSSe/CuAlSe$_2$, CuAlS$_2$/CuGaAlS$_2$, CuGaAlS$_2$/CuGaAlS$_2$, CuGaS$_2$/CuGaSSe, CuGaSSe/CuGaSe$_2$, CuGaS$_2$/CuInGaS$_2$, CuInGaS$_2$/CuInS$_2$, CuInS$_2$/CuInSSe, CuInSSe/CuInSe$_2$, CuGaSe$_2$/CuInGaSe$_2$, CuInGaSe$_2$/CuInSe$_2$, MgSe/MgZnSeTe, and MgZnSeTe/ZnTe.

14. The photovoltaic device according to claim 1, wherein the combinations of the materials that form the dissociation region is at least one selected from Al$_x$Ga$_{1-x}$N/Al$_y$Ga$_{1-y}$N (x≠y), In$_x$Ga$_{1-x}$N/In$_y$Ga$_{1-y}$N (x≠y), AlGa$_x$As$_{1-x}$/AlGa$_y$As$_{1-y}$ (x≠y), In$_x$Ga$_{1-x}$As/In$_y$Ga$_{1-y}$As, AlGa$_x$P$_{1-x}$/AlGa$_y$P$_{1-y}$ (x≠y), GaAS$_x$P$_{1-x}$/GaASyP$_{1-y}$ (x≠y), AlAs$_x$P$_{1-x}$/AlAs$_y$P$_{1-y}$ (x≠y), In$_x$Al$_{1-x}$As/In$_y$Al$_{1-y}$As (x≠y), GaAs$_x$Sb$_{1-x}$/GaAs$_y$Sb$_{1-y}$ (x≠y), Al$_x$Ga$_{1-x}$Sb/Al$_y$Ga$_{1-y}$Sb (x≠y), Al$_x$In$_{1-x}$Sb/Al$_y$In$_{1-y}$Sb (x≠y), Mg$_x$Zn$_{1-x}$S/MgyZn$_{1-y}$S (x≠y), Mg$_x$Zn$_{1-x}$Se/Mg$_y$Zn$_{1-y}$Se (x≠y), CuAl(S$_x$Se$_{1-x}$)$_2$ (x≠y), CuAl$_x$Ga$_{1-y}$S$_2$/CuAl$_y$Ga$_{1-y}$S$_2$ (x≠y), CuGa(S$_x$Se$_{1-x}$)$_2$/CuGa(S$_y$Se$_{1-y}$)$_2$ (x≠y), CuIn$_x$Ga$_{1-x}$S$_2$/CuIn$_y$Ga$_{1-y}$S$_2$ (x≠y), CuIn(S$_x$Se$_{1-x}$)$_2$/CuIn(S$_y$Se$_{1-y}$)$_2$ (x≠y), CuIn$_x$Ga$_{1-x}$Se$_2$/CuIn$_y$Ga$_{1-y}$Se$_2$ (x≠y) and (MgSe)$_x$(ZnTe)$_{1-x}$/(MgSe)$_y$(ZnTe)$_{1-y}$ (x≠y),
where 0<x<1 and 0<y<1.

15. The photovoltaic device according to claim 1, wherein the energy level in at least one of the plurality of layers satisfies $$E_{C1} < E_{F1} \text{ and } E_{V1} > E_{F1},$$

where
$E_{C1}$ represents the energy level at the lower end of the conduction band in the one layer,
$E_{V1}$ represents the energy level at the upper end of the valence band in the one layer, and
$E_{F1}$ represents the Fermi level in the one layer.

16. The photovoltaic device according to claim 1, wherein the inorganic semiconductor includes the photoactive region.

17. The photovoltaic device according to claim 1, further comprising
a stacked body in which a plurality of cells including the organic semiconductor and the inorganic semiconductor are stacked, wherein band gaps of the photoactive region included each of the plurality of the stacked cells become smaller from an incident surface of light along a stacking direction of the cells.

18. The photovoltaic device according to a claim 1, further comprising
a stacked body in which a plurality of cells including the organic semiconductor and the inorganic semiconductor are stacked, wherein
band gaps of the dissociation region included each of the plurality of the stacked cells become smaller from an incident surface of light along a stacking direction of the cells.

19. The photovoltaic device according to claim 1, further comprising
an electrode, wherein
the dissociation region is surrounded by an organic material that forms the organic semiconductor,
a part of the dissociation region is directly connected to the electrode, and
the organic semiconductor and the electrode that is connected to the dissociation region are not in direct contact.

20. The photovoltaic device according to claim 19, further comprises
a protective film provided between the organic semiconductor and the electrode that is connected to the dissociation region.

* * * * *